US012087507B2

(12) United States Patent
Hiraoka et al.

(10) Patent No.: US 12,087,507 B2
(45) Date of Patent: Sep. 10, 2024

(54) CURRENT SEPARATION METHOD, DOPING METHOD, AND DOPING APPARATUS OF NONAQUEOUS LITHIUM POWER STORAGE ELEMENT

(71) Applicant: Asahi Kasei Kabushiki Kaisha, Tokyo (JP)

(72) Inventors: Koichi Hiraoka, Tokyo (JP); Yuima Kimura, Tokyo (JP); Ryusuke Okoshi, Tokyo (JP); Yuji Asano, Tokyo (JP); Sumire Jinno, Tokyo (JP); Ryosuke Baba, Tokyo (JP)

(73) Assignee: Asahi Kasei Kabushiki Kaisha, Tokyo (JP)

( * ) Notice: Subject to any disclaimer, the term of this patent is extended or adjusted under 35 U.S.C. 154(b) by 0 days.

(21) Appl. No.: 18/011,426

(22) PCT Filed: May 30, 2022

(86) PCT No.: PCT/JP2022/021986
§ 371 (c)(1),
(2) Date: Dec. 19, 2022

(87) PCT Pub. No.: WO2023/105818
PCT Pub. Date: Jun. 15, 2023

(65) Prior Publication Data
US 2024/0105396 A1    Mar. 28, 2024

(30) Foreign Application Priority Data

Dec. 10, 2021  (JP) .................................. 2021-201076
Dec. 10, 2021  (JP) .................................. 2021-201080
(Continued)

(51) Int. Cl.
*H01G 11/84* (2013.01)
*G01R 27/26* (2006.01)
(Continued)

(52) U.S. Cl.
CPC ......... *H01G 11/84* (2013.01); *G01R 27/2605* (2013.01); *H01G 11/06* (2013.01);
(Continued)

(58) Field of Classification Search
CPC ........ H01G 11/84; H01G 11/06; H01G 11/34; H01G 11/50; G01R 27/2605; H01M 10/0525; H01M 10/052; H01M 4/382
See application file for complete search history.

(56) References Cited

U.S. PATENT DOCUMENTS 10,636,582 B2 *  4/2020  Kimura ................. H01G 11/34
2010/0153038 A1   6/2010  Tomura et al.
(Continued)

FOREIGN PATENT DOCUMENTS

CN   105745727 A    7/2016
CN   109074962 A    12/2018
(Continued)

OTHER PUBLICATIONS

Written Opinion issued in corresponding International Patent Application No. PCT/JP2022/021986 dated Jul. 26, 2022 (see partial English translation).
(Continued)

*Primary Examiner* — Amy He
(74) *Attorney, Agent, or Firm* — Morgan, Lewis & Bockius LLP

(57) ABSTRACT

An object of the present disclosure is to provide a doping method in which the status of the progress of a main reaction can be estimated in the lithium carbonate decomposition-type doping step of a nonaqueous lithium power storage element. The separation method, the doping method, and the doping apparatus according to the present disclosure include calculating a capacitor current density $i_C$ and an electrode
(Continued)

reaction current density $i_R$ based on voltage and current of a cell that are measured during doping of the cell.

19 Claims, 9 Drawing Sheets

(30) Foreign Application Priority Data

Dec. 10, 2021 (JP) ................................. 2021-201097
Dec. 10, 2021 (JP) ................................. 2021-201101

(51) Int. Cl.
| | | |
|---|---|---|
| H01G 11/06 | (2013.01) | |
| H01G 11/34 | (2013.01) | |
| H01G 11/50 | (2013.01) | |
| H01G 11/52 | (2013.01) | |
| H01M 4/38 | (2006.01) | |
| H01M 10/052 | (2010.01) | |
| H01M 10/0525 | (2010.01) | |

(52) U.S. Cl.
CPC ............. *H01G 11/34* (2013.01); *H01G 11/50* (2013.01); *H01G 11/52* (2013.01); *H01M 4/382* (2013.01); *H01M 10/052* (2013.01); *H01M 10/0525* (2013.01)

(56) References Cited

U.S. PATENT DOCUMENTS

| | | |
|---|---|---|
| 2016/0284479 A1 | 9/2016 | Okuno et al. |
| 2017/0256782 A1 | 9/2017 | Raman et al. |
| 2018/0198300 A1 | 7/2018 | Howey et al. |
| 2019/0074143 A1 | 3/2019 | Naoi et al. |
| 2019/0198941 A1 | 6/2019 | Oniki et al. |
| 2020/0091567 A1 | 3/2020 | Takahashi |
| 2022/0190380 A1 | 6/2022 | Hirakawa et al. |

FOREIGN PATENT DOCUMENTS

| | | |
|---|---|---|
| JP | 2008-241246 A | 10/2008 |
| JP | 5036662 B | 9/2012 |
| JP | 2014-032825 A | 2/2014 |
| JP | 2015-228324 A | 12/2015 |
| JP | 2018-056410 A | 4/2018 |
| JP | 2019-021699 A | 2/2019 |
| JP | 2019-114475 A | 7/2019 |
| JP | 2020-047587 A | 3/2020 |
| JP | 2020-167350 A | 10/2020 |
| WO | 2017/146223 A1 | 8/2017 |
| WO | 2020/203421 A1 | 10/2020 |

OTHER PUBLICATIONS

English translation of Written Opinion issued in corresponding International Patent Application No. PCT/JP2022/021986 dated Feb. 1, 2023.
Supplementary European Search Report issued in European Patent Application No. 22821830.1 dated May 1, 2024.
Li et al., "Physics-informed neural networks for electrode-level state estimation in lithium-ion batteries," Journal of Power Sources, 506: 230034 (Jun. 26, 2021).
Nascimento et al., "Hybrid physics-informed neural networks for lithium-ion battery modeling and prognosis", Journal of Power Sources, 513: 230526 (2021).
Kuchly et al., "Li-ion battery SOC estimation method using a Neural Network trained with date generated by a P2D model", Science Direct, 54 (10): 336-343 (2021).
Wu et al., "Application of artificial neural networks in design of lithium-ion batteries," Journal of Power Sources, 395: 128-136 (2018).

* cited by examiner

CURRENT SEPARATION METHOD, DOPING METHOD, AND DOPING APPARATUS OF NONAQUEOUS LITHIUM POWER STORAGE ELEMENT

FIELD

The present disclosure relates to a current separation method, a doping method, and a doping apparatus of a nonaqueous lithium power storage element.

BACKGROUND

In recent years, from the viewpoint of effective energy utilization aimed at global environmental conservation and resource saving, a great deal of attention is being drawn to, for example, power smoothing systems and nighttime power storage systems for wind power generation, household distributed power storage systems based on photovoltaic power generation technologies, and power storage systems for electric vehicles. Batteries used in these power storage systems are demanded to have a high energy density. As a promising candidate for a high-energy-density battery that can meet such a demand, nonaqueous lithium power storage elements have been actively developed.

A method of producing a nonaqueous lithium power storage element generally includes: assembling a cell that includes a positive electrode having a positive electrode active material layer containing a positive electrode active material, a negative electrode having a negative electrode active material layer containing a negative electrode active material, a separator arranged between the positive electrode and the negative electrode, and an electrolyte solution; and then a step of doping the negative electrode active material with lithium ions. A conventional general doping method includes: assembling a cell using a negative electrode that has a negative electrode active material layer obtained by laminating lithium metal foils; subsequently dissolving the lithium metal foils by applying a voltage to the cell; and allowing the negative electrode active material layer to occlude lithium ions. In recent years, for example, as disclosed in PTL 1, a lithium carbonate decomposition-type doping method including: assembling a cell using a positive electrode precursor that has a positive electrode active material layer containing lithium carbonate and activated carbon; subsequently applying a voltage to the cell to decompose lithium carbonate; and allowing a negative electrode active material to occlude the resulting lithium ions is known.

CITATION LIST

Patent Literature

[PTL 1] Japanese Unexamined Patent Publication (Kokai) No. 2020-167350
[PTL 2] Japanese Unexamined Patent Publication (Kokai) No. 2008-241246
[PTL 3] Japanese Unexamined Patent Publication (Kokai) No. 2019-114475

SUMMARY

Technical Problem

When the same materials are used in nonaqueous lithium power storage elements, their performance (e.g., initial cell capacity and resistance, as well as cell performance after a durability test, such as capacity retention rate, resistance increase rate, and gas generation amount) are greatly affected by the status of the progress of electrode reactions in the doping step. In a lithium carbonate decomposition-type doping method, it is believed that various electrode reactions occur in addition to an electrode reaction of decomposing lithium carbonate (main reaction), and that the status of the progress of each electrode reaction varies with the progress of the doping step. Therefore, in order to, for example, control, predict, or improve the performance of the resulting nonaqueous lithium power storage element, it is important to understand the status of the progress of each electrode reaction, especially the main reaction, in the doping step.

Generally, as a means for estimating the internal state of a secondary battery during charging and discharging, for example, a method of electrochemically estimating electrode reactions based on information such as voltage, current, and temperature of the secondary battery is employed. For instance, PTL 2 discloses an apparatus which detects the voltage, the current, and the temperature of a secondary battery during charging and discharging, dynamically estimates the internal state according to a battery model, and thereby estimates the charging rate of the battery more accurately. PTL 3 discloses a secondary battery system which estimates the state of lithium deposition on a negative electrode of a lithium ion secondary battery by calculating the negative electrode potential using a battery model or the like for calculation of lithium concentration distribution inside a negative electrode active material, and subsequently correcting the negative electrode potential with the state of charge (SOC) of the secondary battery, an average current value in a charging period, and an integrated current value in the charging period. However, there has not been developed a method of estimating the status of the progress of each electrode reaction, especially a main reaction, in the lithium carbonate decomposition-type doping step of a nonaqueous lithium power storage element.

In view of the above, an object of the present disclosure is to provide a current separation method and a doping method, in which the status of the progress of a main reaction can be estimated in the lithium carbonate decomposition-type doping step of a nonaqueous lithium power storage element.

Solution to Problem

Embodiments of the present disclosure are exemplified below.

[1]
A current separation method of a nonaqueous lithium power storage element, wherein
the nonaqueous lithium power storage element includes a cell including: a positive electrode precursor that includes a positive electrode active material layer containing lithium carbonate and activated carbon; a negative electrode that includes a negative electrode active material layer containing a negative electrode active material capable of occluding and releasing lithium; a separator arranged between the positive electrode precursor and the negative electrode; and an electrolyte solution, and
the method includes calculating a capacitor current density $i_C$ and an electrode reaction current density $i_R$ of the cell based on voltage and current of the cell that are measured during doping of the cell.

[2]

A doping method of a nonaqueous lithium power storage element, wherein the nonaqueous lithium power storage element includes a cell including: a positive electrode precursor that includes a positive electrode active material layer containing lithium carbonate and activated carbon; a negative electrode that includes a negative electrode active material layer containing a negative electrode active material capable of occluding and releasing lithium; a separator arranged between the positive electrode precursor and the negative electrode; and an electrolyte solution, and the method includes calculating a capacitor current density $i_C$ and an electrode reaction current density $i_R$ of the cell by the current separation method according to [1].

[3]

The doping method of a nonaqueous lithium power storage element according to [2], including:

(1) the doping condition setting step of setting doping conditions including cell temperature and input voltage;

(2) the measurement step of measuring a positive electrode potential E (V) and a bulk current density i (A/m$^2$) of the cell while applying the input voltage to the cell;

(3) the current density calculation step of, with an assumption of the positive electrode potential E (V) at the time of modifying the system time by $\Delta t$, calculating the capacitor current density $i_C$ (A/m$^2$) of the cell and calculating, based on the Butler-Volmer equation and the diffusion equation, current densities $i_{R1}$ (A/m$^2$) to $i_{RN}$ (A/m$^2$) of electrode reactions 1 to N (wherein, N represents an integer of 3 or larger) including an electrode reaction 1 in which lithium carbonate is decomposed to release lithium ions and electrons;

(4) the positive electrode potential correction step of correcting the assumed positive electrode potential E such that a total current density of the capacitor current density $i_c$ and the current densities $i_{R1}$ to $i_{RN}$ of the respective electrode reactions is equal to the bulk current density i, and thereby obtaining a corrected positive electrode potential E; and (5) the current separation step of repeating the steps (3) and (4) while modifying the system time such that the total current density converges to the bulk current density i.

[4]

The doping method of a nonaqueous lithium power storage element according to [3], further including (6) the step of controlling the doping conditions set in the step (1) such that a difference between the behavior of the corrected positive electrode potential E obtained in the current separation step and the behavior of a target positive electrode potential E is small during doping.

[5]

The doping method of a nonaqueous lithium power storage element according to [3] or [4], wherein, in the step (3), the current densities $i_{R1}$ to $i_{RN}$ are calculated based on the following standards:

(i) in a case where the measured positive electrode potential E is lower than an onset potential of an electrode reaction x (wherein, x corresponds to 1 to N), the current density $i_{Rx}$ of the electrode reaction x is not generated (0 A/m$^2$);

(ii) in a case where the measured positive electrode potential E is equal to or higher than the onset potential of the electrode reaction x, the current density of the electrode reaction x is determined by the Butler-Volmer equation and, when the thus determined current density is lower than a limiting current density of the electrode reaction x, this current density is defined as the current density $i_{Rx}$ of the electrode reaction x; and (iii) in a case where the current density determined based on the above-described (ii) is equal to or higher than the limiting current density of the electrode reaction x, a current density determined by the diffusion equation and the Butler-Volmer equation is defined as the current density $i_{Rx}$ of the electrode reaction x.

[6]

The doping method of a nonaqueous lithium power storage element according to any one of [3] to [5], wherein, in the step (1), the cell temperature is selected from 25° C. to 80° C. and the input voltage is selected from 4.0 V to 5.0 V.

[7]

The doping method of a nonaqueous lithium power storage element according to any one of [3] to [6], wherein, in the step (3), the current density $i_C$ (A/m$^2$) of the cell is calculated by calculating a capacitor current $I_C$ (A) of the cell using the following equation, and dividing the thus obtained value by a positive electrode precursor area (m$^2$):

$$I_C = C \frac{dE}{dt}$$

{wherein, $I_C$ represents the capacitor current (A); C represents a capacitor capacity (F/m$^2$); E represents the assumed positive electrode potential E (V); and t represents time (s)}.

[8]

The doping method of a nonaqueous lithium power storage element according to [5], wherein in the standard (ii), the Butler-Volmer equation of the respective electrode reactions 1 to N is represented by:

$$i_{Rx} = i_{0x} \left\{ \left(\frac{C_{Rx}}{C_{Rx}^e}\right)^{m_x} \exp\left(\frac{\alpha_x n_x F}{RT}\eta_x\right) - \exp\left(-\frac{(1-\alpha_x)n_x F}{RT}\eta_x\right) \right\}$$

$$\eta_x = E - E_x^{eq}$$

{wherein, $i_{Rx}$ represents the current density (A/m$^2$) of the electrode reaction x (wherein, x corresponds to 1 to N); $i_{0x}$ represents an exchange current density (A/m$^2$) of the electrode reaction x; $C_{Rx}$ and $C^e_{Rx}$ represent a reductant surface concentration (mol/m$^3$) and a reductant bulk concentration (mol/m$^3$) of the electrode reaction x, respectively; $m_x$ represents a reaction order (=1); $\alpha_x$ represents a symmetry factor of the electrode reaction x; $n_x$ represents a valence of the electrode reaction x; F represents the Faraday constant; R represents the gas constant; T represents the temperature (K); $\eta_x$ represents an overvoltage (V) of the electrode reaction x; E represents the assumed positive electrode potential (V); and $E_x^{eq}$ represents the onset potential (V) of the electrode reaction x}, and in the standard (iii), the diffusion equation of the respective electrode reactions 1 to N is represented by:

$$\frac{\partial C_{Rx}}{\partial t} = D_x \frac{\partial^2 C_{Rx}}{\partial r^2}$$

{wherein, t represents time (s); $C_{Rx}$ represents the reductant surface concentration (mol/m$^3$) of the electrode reaction x (wherein, x corresponds to 1 to N); $D_x$ represents a reductant diffusion coefficient (m$^2$/s); and r represents a diffusion layer thickness (m)},
with a proviso that:
when r=0, $$C_{Rx}=C_{Rx}^e$$

{wherein, $Ce_{Rx}$ represents the reductant bulk concentration (mol/m$^3$)}; or
when r=$L_0$ (diffusion layer thickness), $$-D_x \frac{\partial C_{Rx}}{\partial r} = Q_x = \frac{i_{Rx}}{n_x F}$$

{wherein, $n_x$ represents the valence of the electrode reaction x; F represents the Faraday constant; $Q_x$ represents a reductant mass flux (mol/m$^2$s); and $i_{Rx}$ represents the current density (A/m$^2$) of the electrode reaction x}.

[9]
The doping method of a nonaqueous lithium power storage element according to any one of [3] to [8], wherein, in the current density calculation step (3):
the electrode reaction 1 is selected to have an onset potential $E_1^{eq}$ in a range of 3.70 V to 4.00 V, a diffusion coefficient $D_1$ in a range of 1.5E-10 m$^2$/s to 1.7E-10 m$^2$/s, an exchange current density $i_{01}$ in a range of 4.00E-03 A/m$^2$ to 6.00E-03 A/m$^2$, and a symmetry factor α1 in a range of 0.07 to 0.10, and
the electrode reactions 2 to N are each independently selected to have an onset potential $E_x^{eq}$ in a range of 3.00 V to 3.50 V, a diffusion coefficient $D_x$ in a range of 0.5E-10 m$^2$/s to 1.5E-10 m$^2$/s, an exchange current density $i_{0x}$ in a range of 0.50E-03 A/m$^2$ to 3.00E-03 A/m$^2$, a valence $n_x$ in a range of an integer of 1 to 4, and a symmetry factor $α_1$ in a range of 0.10 to 0.90.

[10]
A doping apparatus of a nonaqueous lithium power storage element, wherein
the nonaqueous lithium power storage element includes a cell including: a positive electrode precursor that includes a positive electrode active material layer containing lithium carbonate and activated carbon; a negative electrode that includes a negative electrode active material layer containing a negative electrode active material capable of occluding and releasing lithium; a separator arranged between the positive electrode precursor and the negative electrode; and an electrolyte solution, and
the control apparatus mathematically separates a bulk current density in the doping step into a capacitor current density $i_C$ and an electrode reaction current density $i_R$ by the current separation method according to [1].

[11]
The doping apparatus according to [10], wherein the control apparatus includes the following control units:
(1) a doping condition setting unit which sets doping conditions including cell temperature and input voltage;
(2) a measurement unit which measures a positive electrode potential E (V) and a bulk current density i (A/m$^2$) of the cell while applying the input voltage to the cell;
(3) a current density calculation unit which, assuming the positive electrode potential E (V) at the time of modifying the system time by Δt, calculates the capacitor current density $i_C$ (A/m$^2$) of the cell and calculates, based on the Butler-Volmer equation and the diffusion equation, current densities $i_{R1}$ (A/m$^2$) to $i_{RN}$ (A/m$^2$) of electrode reactions 1 to N (wherein, N represents an integer of 3 or larger) including an electrode reaction 1 in which lithium carbonate is decomposed to release lithium ions and electrons;
(4) a positive electrode potential correction unit which corrects the assumed positive electrode potential E such that a total current density of the capacitor current density $i_C$ and the current densities $i_{R1}$ to $i_{RN}$ of the respective electrode reactions is equal to the bulk current density i, and thereby obtains a corrected positive electrode potential E; and
(5) a current separation unit which repeats the controls performed by the control units (3) and (4) while modifying the system time such that the total current density converges to the bulk current density i.

[12]
The doping apparatus of a nonaqueous lithium power storage element according to [11], further including (6) a doping condition control unit which controls the doping conditions set in the control unit (1) such that a difference between the behavior of the corrected positive electrode potential E obtained by the current separation unit and the behavior of a target positive electrode potential E is small during doping.

[13]
The doping apparatus of a nonaqueous lithium power storage element according to [11] or [12], wherein the calculation by the control unit (3) is performed based on the following standards:
(i) in a case where the measured positive electrode potential E is lower than an onset potential of an electrode reaction x (wherein, x corresponds to 1 to N), the current density $i_{Rx}$ of the electrode reaction x is not generated (0 A/m$^2$);
(ii) in a case where the measured positive electrode potential E is equal to or higher than the onset potential of the electrode reaction x, the current density of the electrode reaction x is determined by the Butler-Volmer equation and, when the thus determined current density is lower than a limiting current density of the electrode reaction x, this current density is defined as the current density $i_{Rx}$ of the electrode reaction x; and
(iii) in a case where the current density determined based on the above-described (ii) is equal to or higher than the limiting current density of the electrode reaction x, a current density determined by the diffusion equation and the Butler-Volmer equation is defined as the current density $i_{Rx}$ of the electrode reaction x.

[14]
The doping apparatus of a nonaqueous lithium power storage element according to any one of [11] to [13], wherein, in the control unit (1), the cell temperature is selected from 25° C. to 80° C. and the input voltage is selected from 4.0 V to 5.0 V.

[15]
The doping apparatus of a nonaqueous lithium power storage element according to any one of [11] to [14], wherein, in the control unit (3), the current density $i_C$ (A/m$^2$) of the cell is calculated by calculating a capacitor current $I_C$ (A) of the cell using the following equation, and dividing the thus obtained value by a positive electrode precursor area (m²):

$$I_C = C\frac{dE}{dt}$$

{wherein, $I_C$ represents the capacitor current (A); C represents a capacitor capacity (F/m²); E represents the assumed positive electrode potential E (V); and t represents time (s)}.

[16]

The doping apparatus of a nonaqueous lithium power storage element according to [15], wherein, in the standard (ii), the Butler-Volmer equation of the respective electrode reactions 1 to N is represented by:

$$i_{Rx} = i_{0x}\left\{\left(\frac{C_{Rx}}{C_{Rx}^e}\right)^{m_x}\exp\left(\frac{\alpha_x n_x F}{RT}\eta_x\right) - \exp\left(-\frac{(1-\alpha_x)n_x F}{RT}\eta_x\right)\right\}$$

$$\eta_x = E - E_x^{eq}$$

{wherein, $i_{Rx}$ represents the current density (A/m²) of the electrode reaction x (wherein, x corresponds to 1 to N); $i_{0x}$ represents an exchange current density (A/m²) of the electrode reaction x; $C_{Rx}$ and $C^e_{Rx}$ represent a reductant surface concentration (mol/m³) and a reductant bulk concentration (mol/m³) of the electrode reaction x, respectively; $m_x$ represents a reaction order (=1); $\alpha_x$ represents a symmetry factor of the electrode reaction x; $n_x$ represents a valence of the electrode reaction x; F represents the Faraday constant; R represents the gas constant; T represents the temperature (K); $\eta_x$ represents an overvoltage (V) of the electrode reaction x; E represents the assumed positive electrode potential (V); and $E_x^{eq}$ represents the onset potential (V) of the electrode reaction x}, and in the standard (iii), the diffusion equation of the respective electrode reactions 1 to N is represented by:

$$\frac{\partial C_{Rx}}{\partial t} = D_x\frac{\partial^2 C_{Rx}}{\partial r^2}$$

{wherein, t represents time (s); $C_{Rx}$ represents the reductant surface concentration (mol/m³) of the electrode reaction x (wherein, x corresponds to 1 to N); $D_x$ represents a reductant diffusion coefficient (m²/s); and r represents a diffusion layer thickness (m)},
with a proviso that:
when r=0, $$C_{Rx} = C_{Rx}^e$$

{wherein, $Ce_{Rx}$ represents the reductant bulk concentration (mol/m³)}; or
when $r=L_0$ (diffusion layer thickness), $$-D_x\frac{\partial C_{Rx}}{\partial r} = Q_x = \frac{i_{Rx}}{n_x F}$$

{wherein, $n_x$ represents the valence of the electrode reaction x; F represents the Faraday constant; $Q_x$ represents a reductant mass flux (mol/m² s); and $i_{Rx}$ represents the current density (A/m²) of the electrode reaction x}.

[17]

The doping apparatus of a nonaqueous lithium power storage element according to any one of [11] to [16], wherein, in the current separation unit:

the electrode reaction 1 is selected to have an onset potential $E_1^{eq}$ in a range of 3.70 V to 4.00 V, a diffusion coefficient $D_1$ in a range of 1.5E-10 m²/s to 1.7E-10 m²/s, an exchange current density $i_{01}$ in a range of 4.00E-03 A/m² to 6.00E-03 A/m², and a symmetry factor $\alpha_1$ in a range of 0.07 to 0.10, and the electrode reactions 2 to N are each independently selected to have an onset potential $E_x^{eq}$ in a range of 3.00 V to 3.50 V, a diffusion coefficient $D_x$ in a range of 0.5E-10 m²/s to 1.5E-10 m²/s, an exchange current density $i_{0x}$ in a range of 0.50E-03 A/m 2 to 3.00E-03 A/m², a valence $n_x$ in a range of an integer of 1 to 4, and a symmetry factor $\alpha_1$ in a range of 0.10 to 0.90.

[18]

The control apparatus according to [12], wherein the control unit (6) is included in a control apparatus different from the control apparatus that includes the control units (1) to (5).

[19]

A doping system of a nonaqueous lithium power storage element, including:

the control apparatus according to any one of [10] to [18];

an adjustment apparatus which adjusts the cell temperature and the input voltage based on signals from the control apparatus; and a measurement apparatus which acquires information regarding the positive electrode potential E (V) and the bulk current density i (A/m²) of the cell, and transmits signals relating to the thus acquired information to the control apparatus.

[20]

The doping system of a nonaqueous lithium power storage element according to [19], further including a display device which displays information regarding the status of the progress of at least one electrode reaction in the doping step.

[21]

The doping system of a nonaqueous lithium power storage element according to [19] or [20], further including a warning device which can issue a warning in accordance with the contents of real-time control in the doping step.

Advantageious Effects of Invention

According to the present disclosure, a doping method in which the status of the progress of a main reaction can be estimated in the lithium carbonate decomposition-type doping step of a nonaqueous lithium power storage element is provided.

The ability to estimate the status of the progress of the main reaction enables to, for example, manage, predict, or improve the performance of a nonaqueous lithium power storage element to be obtained. More specifically, a learned model which has learned the correlation of the electrode production data and the status of the progress of the main reaction estimated by the method of the present disclosure with the actual performance of a nonaqueous lithium power storage element at the time can be obtained. By inputting the electrode production data of an unknown system and the status of the progress of the main reaction to the learned model, the performance of the resulting nonaqueous lithium power storage element can be predicted, and whether or not a specific performance level is satisfied can be managed. Alternatively, when the desired performance of a nonaqueous lithium power storage element are input to the learned model, the learned model outputs preferred electrode production conditions and/or doping conditions that can be utilized for improvement of the performance.

DESCRIPTION OF EMBODIMENTS

Figure 1:
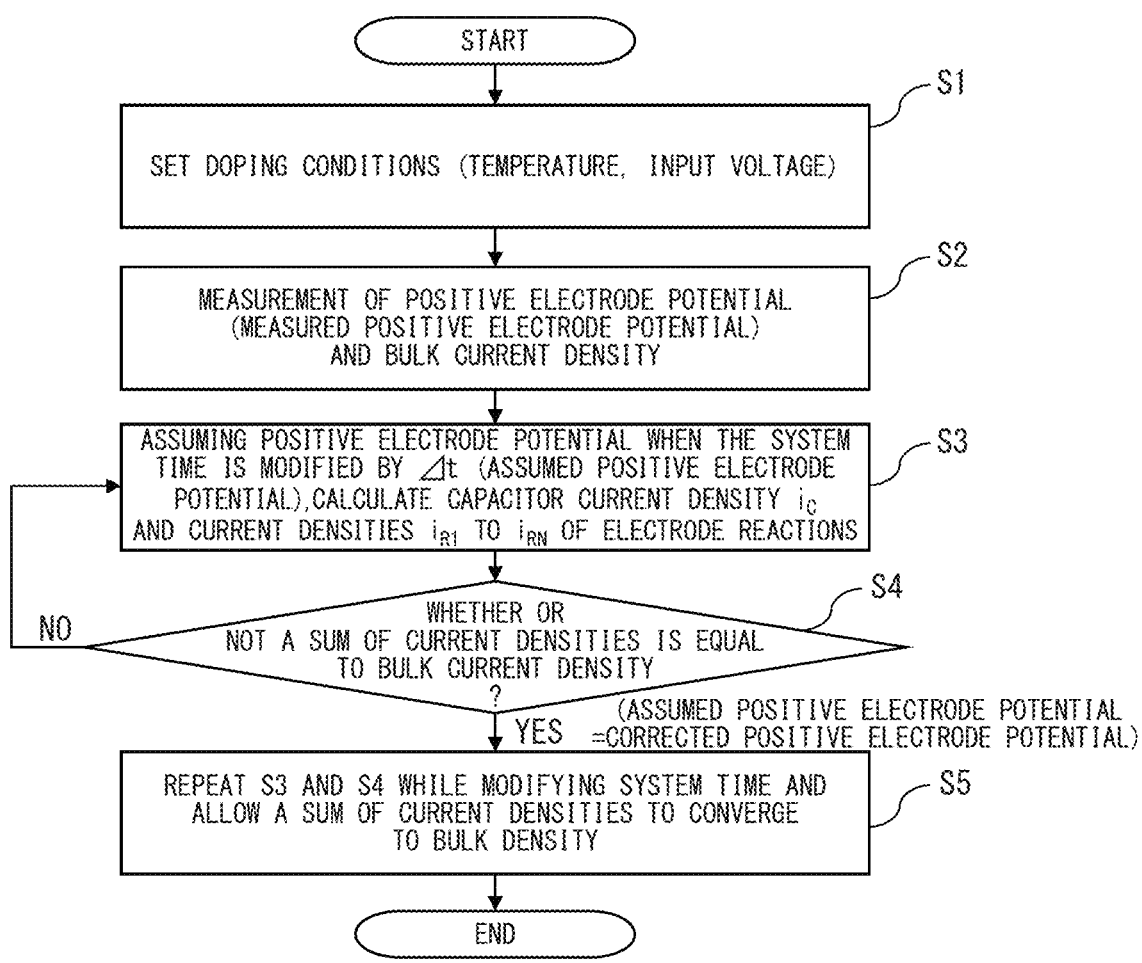
FIG. 1 is a flow chart describing one example of the doping method of a nonaqueous lithium power storage element according to the present disclosure.

<<Current Separation Method and Doping Method of Nonaqueous Lithium Power Storage Element>>

The current separation method and the doping method of a nonaqueous lithium power storage element according to the present disclosure pertains to a lithium carbonate decomposition-type doping method. In other words, the current separation method and the doping method according to the present disclosure pertains to a nonaqueous lithium power storage element which includes a cell including: a positive electrode precursor that includes a positive electrode active material layer containing lithium carbonate and activated carbon; a negative electrode that includes a negative electrode active material layer containing a negative electrode active material capable of occluding and releasing lithium; a separator arranged between the positive electrode precursor and the negative electrode; and an electrolyte solution. By using a positive electrode precursor that includes a positive electrode active material layer containing lithium carbonate and activated carbon, lithium carbonate is decomposed in the doping step to release lithium ions, and these lithium ions can be occluded by a negative electrode active material. Hereinafter, a positive electrode prior to the completion of the doping step is referred to as "positive electrode precursor" and distinguished from a "positive electrode" on which the doping step has been completed. The doping method of the present disclosure may be performed on a single cell, or may be performed on a cell stack of a nonaqueous lithium power storage element that includes two or more cells. The term "cell" used herein encompasses a single cell and a cell stack.

The current separation method of the present disclosure includes calculating the capacitor current density and the electrode reaction current density of a cell based on voltage and current of the cell that are measured during doping of the cell. The doping method of the present disclosure includes calculating the capacitor current density and the electrode reaction current density of a cell using the current separation method of the present disclosure. More particularly, the doping method of the present disclosure includes: (1) the doping condition setting step; (2) the measurement step; (3) the step of calculating the capacitor current density and the current densities of electrode reactions based on an assumed positive electrode potential; (4) the step of correcting the assumed positive electrode potential based on the bulk current density; and (5) the current separation step of repeating the steps (3) and (4) while modifying the system time. In other words, the doping method of the present disclosure, using the current separation method of the present disclosure in the step (3) and focusing on the side of the positive electrode precursor between the positive electrode precursor and the negative electrode, mathematically separates the bulk current density (current density of whole cell) in the doping step into current densities of plural electrode reactions assumed to occur on the positive electrode precursor. This enables to estimate the status of the progress of at least a main reaction (lithium carbonate decomposition reaction). For example, the state of the main reaction among the plural electrode reactions can be estimated, including how dominant the progress of the main reaction is (or was) and quantitatively how much of the main reaction has been (or was) completed. The estimated status of the progress of the main reaction can be utilized for control of the doping conditions of the resulting nonaqueous lithium power storage element, as well as management and prediction, improvement or the like of the performance of the nonaqueous lithium power storage element. The doping method of the present disclosure preferably further includes (6) the control step of, based on the estimated status of the progress, controlling the doping conditions such that a difference in behavior between the corrected positive electrode potential and the target positive electrode potential is small during the doping method.

Figure 2:
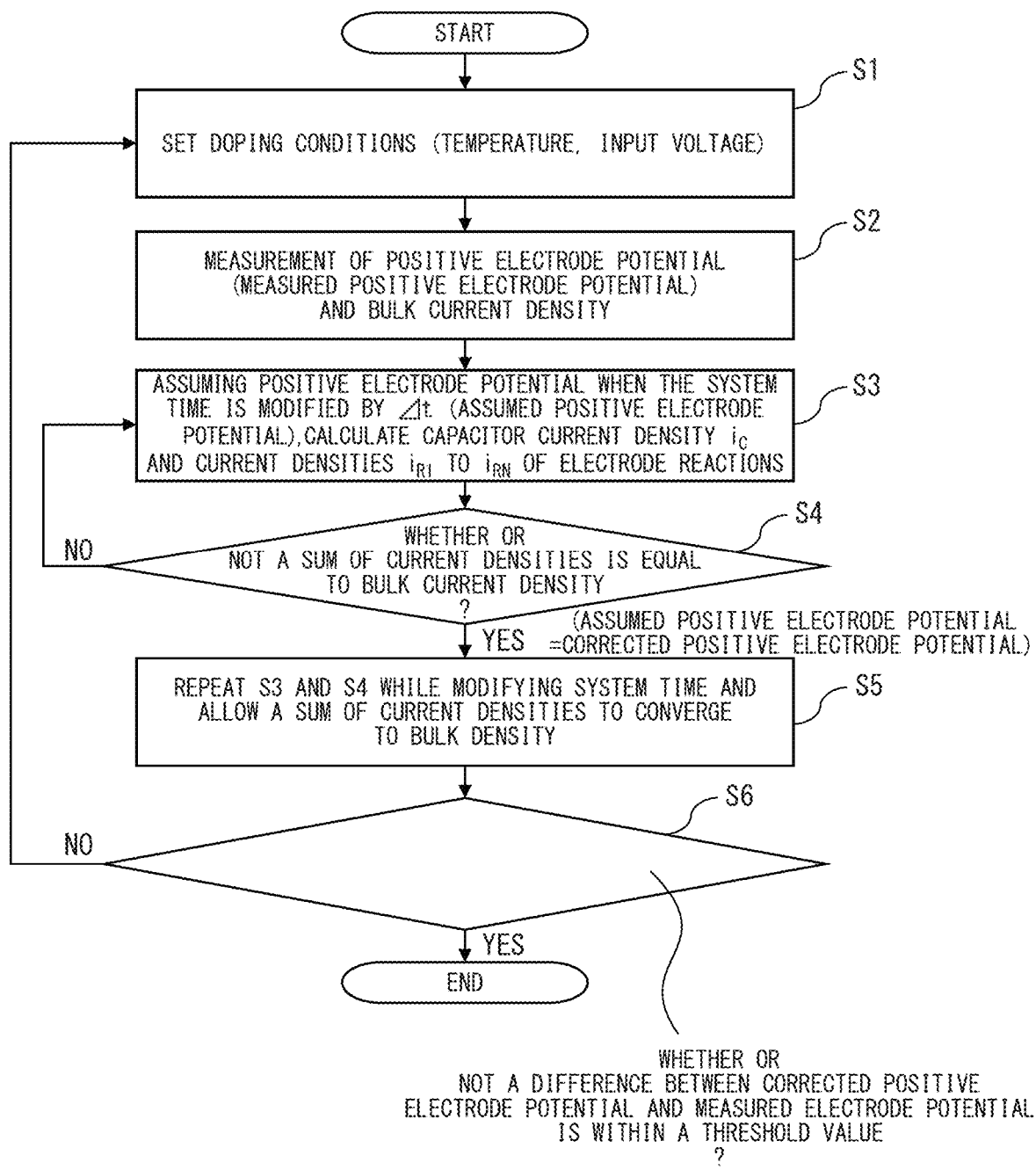
FIG. 2 is a flow chart describing another example of the doping method of a nonaqueous lithium power storage element according to the present disclosure.

FIGS. 1 and 2 are each a flow chart that describes the doping method of a nonaqueous lithium power storage element according to the present disclosure. Each step thereof will now be described referring to the symbols used in FIGS. 1 and 2; however, the method of the present disclosure is not limited to the modes of FIGS. 1 and 2.

<Doping Condition Setting Step>

The doping condition setting step (S1) is the step of setting doping conditions including cell temperature (° C.) and input voltage (V). Examples of the doping conditions include bulk current (A), bulk current density ($A/m^2$), and cell pressure ($kgf/cm^2$), in addition to cell temperature (° C.) and input voltage (V). The doping conditions can be set and adjusted using condition adjustment devices connected to the cell, such as a charge-discharge device, a temperature regulator, and a pressure regulator.

The "cell temperature" refers to the temperature of the system that is measured as the temperature of the cell outer package. The cell temperature is selected to be in a range of preferably 25° C. or higher, 30° C. or higher, or 35° C. or higher, but preferably 80° C. or lower, 75° C. or lower, 70°

C. or lower, or 65° C. or lower. When the cell temperature is 25° C. or higher, lithium carbonate contained in the positive electrode precursor is efficiently decomposed, so that doping of lithium ions can be performed quickly. When the cell temperature is 80° C. or lower, decomposition of the electrolyte solution can be inhibited, so that the resistance of the nonaqueous lithium power storage element can be reduced.

The "input voltage" refers to the voltage of an external power supply that is applied to the cell in the doping step. The input voltage is selected to be in a range of preferably 4.0 V or more, 4.2 V or more, or 4.4 V or more, but preferably 5.0 V or less, 4.8 V or less, or 4.6 V or less. When the input voltage is 4.0 V or more, lithium carbonate contained in the positive electrode precursor is efficiently decomposed, so that doping of lithium ions can be performed quickly. When the input voltage is 5.0 V or less, a micro short circuit in the doping step can be inhibited.

The "bulk current" refers to a total amount of electric current flowing in the whole cell in the doping step. The bulk current is selected to be in a range of, preferably 0.1 C or more, 1 C or more, or 10 C or more, but 100 C or less, 50 C or less, 40 C or less, or 30 C or less, in terms of C rate. When the bulk current is 0.1 C or more, lithium carbonate contained in the positive electrode precursor is efficiently decomposed, so that doping of lithium ions can be performed quickly. When the bulk current is 100 C or less, the voltage applied to the positive electrode precursor is not excessively high, so that corrosion of a positive electrode current collector can be inhibited.

The "bulk current density" refers to a value obtained by dividing the bulk current by the positive electrode precursor area (area of positive electrode active material layer). The bulk current density is selected to be in a range of preferably 0.04 $A/m^2$ or higher, 0.4 $A/m^2$ or higher, or 1.3 $A/m^2$ or higher, but preferably 45 $A/m^2$ or lower, 40 $A/m^2$ or lower, or 35 $A/m^2$ or lower. When the bulk current density is 0.4 $A/m^2$ or higher, lithium carbonate contained in the positive electrode precursor is efficiently decomposed, so that doping of lithium ions can be performed quickly. When the bulk current density is 45 $A/m^2$ or lower, the voltage applied to the positive electrode precursor is not excessively high, so that corrosion of a positive electrode current collector can be inhibited.

The "cell pressure" refers to a pressure exerted by a force that is optionally applied from the outside of the cell outer package in the direction perpendicular to the electrode surface in the doping step. The cell pressure causes fluctuations in the inter-electrode distance and the liquid retention amount, and this leads to accumulation of Li ions on the electrode surface and an increase or decrease in the local electric field strength caused by electrode deflection, consequently affecting the electrode reaction rate and the electrode reaction species. The cell pressure is selected to be in a range of preferably 0.1 $kgf/cm^2$ or higher, 0.5 $kgf/cm^2$ or higher, or 1 $kgf/cm^2$ or higher, but 1,000 $kgf/cm^2$ or lower, 100 $kgf/cm^2$ or lower, or 10 $kgf/cm^2$ or lower. When the cell pressure is 0.1 $kgf/cm^2$ or higher, distortion of the positive electrode precursor and that of the negative electrode are corrected by the pressure, and the distance between the opposing positive electrode precursor and negative electrode is thereby made uniform in a plane; therefore, doping is uniformly performed and the durability of the resulting nonaqueous lithium power storage element is improved, which is preferred. When the cell pressure is 1,000 $kgf/cm^2$ or lower, damage to the members constituting the cell, such as the positive electrode precursor, the negative electrode, and the separator, is reduced.

Examples of a charging method in the doping step include constant-current charging and constant-voltage charging. For example, the positive electrode voltage can be increased by constant-current charging in the period from start to early stage of the doping step and, once the positive electrode voltage reaches an arbitrary value, the charging method can be switched to constant-voltage charging. This prevents the positive electrode voltage of the cell from being increased more than necessary, so that the occurrence of an undesirable side reaction, such as decomposition of the electrolyte solution, can be inhibited. The method of the present disclosure can be employed for both constant-current charging and constant-voltage charging. In the period from start to early stage of the doping step, various side reactions are likely to occur with an increase in the positive electrode potential, and it is thus highly necessary to estimate the status of the progress of the main reaction; therefore, it is effective to employ the method of the present disclosure in the stage of constant-current charging, which is a period from the start of the doping step until the switching to constant-voltage charging.

The duration of the doping step is preferably 0.5 hours or longer, 1 hour or longer, or 1.5 hours or longer, but preferably 30 hours or shorter, 10 hours or shorter, or 5 hours or shorter, as measured from the start of applying the input voltage. When the duration of the doping step is 0.5 hours or longer, doping of lithium ions is allowed to proceed sufficiently. When the duration of the doping step is 30 hours or shorter, undesirable side reactions such as decomposition of the electrolyte solution can be inhibited, so that the resistance of the resulting nonaqueous lithium power storage element can be reduced.

When constant-current charging is performed from the start to early stage of the doping step, the duration of the constant-current charging is preferably 15 minutes or longer, 30 minutes or longer, or 1 hour or longer, but preferably 4 hours or shorter, 3 hours or shorter, or 2 hours or shorter. When the duration of the constant-current charging is in this range, not only the doping step can be performed quickly, but also side reactions can be inhibited without an excessive increase in the positive electrode voltage of the cell. The constant-current charging is switched to constant-voltage charging at a measured positive electrode potential of preferably 4.3 V or more, 4.4 V or more, or 4.5 V or more, but preferably 4.9 V or less, 4.8 V or less, or 4.7 V or less.

<Measurement Step>

The measurement step (S2) is the step of measuring the positive electrode potential E (V) and the bulk current density i ($A/m^2$) of the cell while applying the input voltage to the cell. By applying the input voltage, lithium carbonate existing in the positive electrode precursor is decomposed to release lithium ions, and the negative electrode active material can be doped with the lithium ions. In the measurement step, for example, the cell temperature (° C.) and the cell pressure ($kgf/cm^2$) can also be measured in addition to the positive electrode potential and the bulk current density of the cell. These physical properties can each be measured using a measurement device connected to the respective measurement spots of the cell as required, such as a voltage line, a reference electrode, a current line, a thermocouple, or a pressure gauge.

The positive electrode potential E (V) of the cell can be determined by, but not limited to, connecting a voltage line to the positive electrode and negative electrode terminal of the cell to measure the cell voltage, and putting a lithium reference electrode into the cell to measure the reference electrode potential. Alternatively, the positive electrode potential E (V) may be estimated by measuring the cell voltage without a reference electrode. The measured positive electrode potential E (V) of the present disclosure encompasses the positive electrode potential that is directly measured using a reference electrode, and the positive electrode potential that is indirectly determined from the measured cell voltage or the like. The bulk current density i (A/m²) of the cell can be determined by connecting a current line to the positive electrode and negative electrode terminal of the cell to measure the bulk current (A) and dividing the thus measured value by the positive electrode precursor area (area of positive electrode active material layer). The positive electrode potential and the bulk current density that are measured in the measurement step are hereinafter referred to as "measured positive electrode potential" and "measured bulk current density", respectively.

<Current Density Calculation Step>

The current density calculation step (S3) is the step of assuming the positive electrode potential E (V) when the system time is modified by Δt at the time of the above-described measurement and, based on this assumption, calculating the capacitor current density $i_C$ (A/m²) of the cell and the current densities $i_{R1}$ (A/m²) to $i_{RN}$ (A/m²) of the respective assumed N kinds of electrode reactions. The positive electrode potential assumed in the current density calculation step is hereinafter referred to as "assumed positive electrode potential". The current density calculation step can be performed using an information processing apparatus (computer) connected to external devices such as a cell condition adjustment apparatus and a measurement apparatus. The information processing apparatus includes: a memory device which stores, for example, programs for executing current density calculation and the like, parameters, measurement data, and calculation results; an arithmetic device which performs current density calculation and the like; and a control device which can control the operations of external devices such as a charge-discharge device. The programs allows the information processing apparatus to execute information processing in the doping method of the present disclosure, such as current density calculation, positive electrode potential correction, and current separation.

The positive electrode potential can be assumed by assuming the change in the measured positive electrode potential with a change in the system time by Δt, based on the measured positive electrode potential, the input voltage, and the measured bulk current density at a certain time point.

One example of the calculation of the capacitor current density $i_C$ will now be described. The "capacitor current" refers to the electric current that flows at the time of the formation of an electric double layer as a capacitor on the positive electrode precursor of the cell. Denoting an accumulated charge, a capacitor capacity, and a positive electrode potential as Q (C), C (F/m²), and E (V), respectively, since Q=CE, differentiation of both sides thereof establishes the following relationship:

$$\frac{dQ}{dt} = C\frac{dE}{dt} \quad (1)$$

i.e., $$I_C = C\frac{dE}{dt} \quad (2)$$

In the equation (1), $I_c$ represents the capacitor current (A), C represents the capacitor capacity (F/m²) of the cell, E represents the assumed positive electrode potential E (V), and t represents time (s). The capacitor capacity C (F/m²) can be set in accordance with the type and the amount of the activated carbon-containing positive electrode active material used in the positive electrode precursor. Accordingly, the capacitor current density is can be calculated by dividing the capacitor current $I_C$ (A), which is determined by the equation (2), by the positive electrode precursor area (area of positive electrode active material layer) (m²).

When a total of N types of electrode reactions 1 to N are assumed as plural electrode reactions, N is preferably 3 or more, or 4 or more, but preferably 10 or less, or 5 or less. When N is 3 or more, the status of the progress of a main reaction can be estimated more accurately, while when N is 10 or less, a sum of calculated current densities is easily converged to a measured bulk current density. N is more preferably 3 or 4.

The electrode reactions occurring on the positive electrode precursor in the doping step can be generalized as the following electrode reaction in which a reductant (Red) is oxidized into an oxidant (Ox), releasing n moles of electrons (e):

Red→Ox+ne⁻

The assumed plural electrode reactions include at least an electrode reaction in which lithium carbonate is decomposed to release lithium ions and electrons as a main reaction (electrode reaction 1). This main reaction can be assumed to be, for example, as follows:

$Li_2CO_3$+solvent→$2Li^+$+$2CO_2$+$C_xH_yO_z$+2e⁻

In this formula, "solvent" represents an electrolyte solution solvent; "$C_xH_yO_z$" represents an organic compound generated by abstraction of CO from the electrolyte solution solvent; and x, y and z are preferably 1 to 5, 2 to 10, and 1 to 3, respectively.

When ethylene carbonate (EC) exists in the system as the electrolyte solution solvent, the main reaction can be assumed to be, for example, as follows:

$Li_2CO_3$+EC→$2Li^+$+$2CO_2$+$C_2H_4O_2$+2e⁻

In this decomposition reaction of lithium carbonate, the reductant is EC, and the electric charge is 2.

The assumed plural electrode reactions include at least one side reaction in addition to the main reaction. Examples of the side reaction include a water splitting reaction, a decomposition reaction of an electrolyte solution solvent, and a decomposition reaction of a lithium salt. The water splitting reaction is typically derived from water contained in activated carbon, and can be preferably assumed to be as follows:

$H_2O$→$H^+$+·OH+e⁻

In this formula, "·OH" represents a hydroxy radical. In this water splitting reaction, the reductant is $H_2O$, and the electric charge is 1.

The decomposition reaction of an electrolyte solution solvent can be assumed to be, for example, as follows:

solvent→(solvent**)+$H^+$+e⁻

In this formula, "solvent" represents the electrolyte solution solvent, and "(solvent**)" represents an oxidant (radical) generated by hydrogen abstraction from the electrolyte solution solvent. In this decomposition reaction of an electrolyte solution solvent, the reductant is the electrolyte solution solvent, and the electric charge is 1. For example, when the electrolyte solution solvent is ethylene carbonate, the decomposition reaction can be assumed to be as follows:

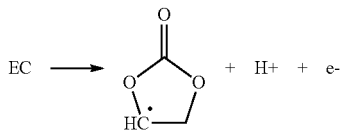

In this decomposition reaction of ethylene carbonate, the reductant is EC, and the electric charge is 1.

Examples of the decomposition reaction of a lithium salt include a decomposition reaction of a lithium salt contained in a nonaqueous electrolyte solution. For example, when the lithium salt is $LiPF_6$, the decomposition reaction can be assumed to be, for example, as follows:

$H_2O + LiPF_6 \rightarrow LiF + 2HF + POF_3$, or $Li_2CO_3 + LiPF_6 \rightarrow 3LiF + CO_2 + POF_3$ In this decomposition reaction of $LiPF_6$, the reductant is $LiPF_6$.

The current density $i_{Rx}$ (A/m²) of a certain electrode reaction x (wherein, x corresponds to 1 to N) can be determined based on the Butler-Volmer equation when the electrode reaction of interest is judged to be rate-limiting, or based on the diffusion equation when the electrode reaction of interest is judged to be diffusion-limited. More particularly, the current density $i_{Rx}$ (A/m²) can be calculated based on the following standards (i) to (iii):

(i) in a case where the measured positive electrode potential E is lower than an onset potential of an electrode reaction x (wherein, x corresponds to 1 to N), the current density $i_{Rx}$ of the electrode reaction x is not generated (0 A/m²);

(ii) in a case where the measured positive electrode potential E is equal to or higher than the onset potential of the electrode reaction x, the current density of the electrode reaction x is determined by the Butler-Volmer equation and, when the thus determined current density is lower than a limiting current density of the electrode reaction x, this current density is defined as the current density $i_{Rx}$ of the electrode reaction x; and (iii) in a case where the current density determined based on the above-described (ii) is equal to or higher than the limiting current density of the electrode reaction x, a current density determined by the diffusion equation and the Butler-Volmer equation is defined as the current density $i_{Rx}$ of the electrode reaction x.

Regarding Standard (i):

The standard (i) prescribes that the current density $i_{Rx}$ of the electrode reaction x is not generated (0 A/m²) when the measured positive electrode potential is lower than the onset potential of the electrode reaction x. The electrode reactions on the positive electrode precursor are reactions that involve release of electrons, and can proceed when the positive electrode potential E (V) of the cell is equal to or higher than the onset potential $E_x^{eq}$ (V) of the electrode reaction x (i.e. when an overvoltage (V) is generated for the electrode reaction x). In the period from start to early stage of the doping step, it is believed that, as the measured positive electrode potential increases, the electrode reactions sequentially occur in the order of ascending onset potential $E_x^{eq}$ (V), generating a current density. Accordingly in order to more accurately estimate the status of the progress of the main reaction, it is preferred to set a value of the onset potential $E_x^{eq}$ (V) as a parameter for each of the assumed plural electrode reactions. When the measured positive electrode potential E (V) of the cell is lower than the onset potential $E_x^{eq}$ (V), the current density $i_{Rx}$ of the electrode reaction of interest is deemed to be 0 A/m² and not taken into account, and it can be taken into account at equal to or higher than the onset potential $E_x^{eq}$ (V). More specifically, the current density $i_{Rx}$ can be taken into account based on the following standards (ii) and (iii).

Regarding Standard (ii):

The standard (ii) prescribes that, in a case where the measured positive electrode potential is equal to or higher than the onset potential of the electrode reaction x, the current density of the electrode reaction x is determined by the Butler-Volmer equation and, when the thus determined current density is lower than a limiting current density of the electrode reaction x, this current density is adopted as the current density $i_{Rx}$ of the electrode reaction x. Generally, the progress of an electrode reaction can be explained with a reaction rate-limiting step in which a charge transfer reaction (electron donating-accepting reaction) is rate-limiting, and a diffusion-limited step in which diffusion (mass transfer) is rate-limiting. It is believed that, while the rate of such an electrode reaction is an exponential function of the electrode potential, the rate constant of mass transfer such as diffusion remains constant irrespective of the electrode potential. In the period from start to early stage of the electrode reaction where a large amount of reactants exists in the vicinity of the electrode surface, the charge transfer reaction is rate-limiting irrespective of diffusion (mass transfer), and the current exponentially increases with an increase in the electrode potential. Once the amount of the reactants existing in the vicinity of the electrode surface is reduced with the progress of the reaction to a certain extent, diffusion (mass transfer) becomes rate-limiting, creating a situation where the reactants undergo a reaction as soon as they reach the electrode surface. In this diffusion-limited step, the current does not increase even with an increase in the electrode potential, reaching a certain limit value. Generally, this limit value of the current is referred to as "limiting current", and the density thereof is referred to as "limiting current density". In other words, the phrase "when the thus determined current density is lower than a limiting current density of the electrode reaction x" in the standard (ii) means a case where the electrode reaction is judged to be in the reaction rate-limiting step.

In the reaction rate-limiting step, the current density can be estimated based on the Butler-Volmer equation. One example of derivation of the Butler-Volmer equation will now be described. First, the following general electrode reaction on the electrode surface is assumed:

$Red \rightleftharpoons Ox + ne^-$

The current density $i_R$ generated by this electrode reaction is a sum of the partial anode current density $i_a$ (A/m²) corresponding to oxidation of a reductant (Red) and the partial cathode current density $i_c$ (A/m²) corresponding to reduction of an oxidant (Ox), which is represented by the following equation:

$$i_R = i_a + i_c \qquad (3)$$

Since an electric current is a charge transfer rate, an electric current generated by an electrode reaction is proportional to the rate of the electrode reaction. The rate of the electrode reaction is proportional to the concentration of reactants on the electrode surface; therefore, the partial anode current density $i_a$ (A/m²) and the partial cathode current density $i_c$ (A/m²) can be represented by the following equations in accordance with the Faraday's law:

$$i_a = nFk_{ox}C_R$$

$$i_c = -nFk_{red}C_O$$

Substitution of these equations into the equation (3) gives:

$$i_R = nFk_{ox}C_R - nFk_{red}C_O \quad (4)$$

In this equation (4), n represents the valence of the electrode reaction; F represents the Faraday constant; $k_{ox}$ and $k_{red}$ represent the rate constant in the direction of oxidation and that in the direction of reduction, respectively; and $C_R$ and $C_O$ represent the reductant concentration and the oxidant concentration on the electrode surface, respectively.

The rate constants of the electrode reaction conform to the Arrhenius equation and, considering that the activation energy is affected by the electrode potential, the rate constants $k_{ox}$ and $k_{red}$ of the electrode reaction in the direction of oxidation and the direction of reduction are represented by the following equations, respectively:

$$k_{ox} = k_{ox}°\cdot \exp\left(\frac{\alpha nFE}{RT}\right) \quad (5)$$

$$k_{red} = k_{red}°\cdot \exp\left(-\frac{(1-\alpha)nFE}{RT}\right) \quad (6)$$

In these equations (5) and (6), $k_{ox}°$ and $k_{red}°$ represent the rate constant in the direction of oxidation and that in the direction of reduction at an electrode potential of 0 (zero), respectively; α represents the symmetry factor which is the transfer coefficient in the direction of oxidation; and (1−α) represents the transfer coefficient in the direction of reduction. Further, F represents the Faraday constant, R represents the gas constant, and T represents the temperature (K). Substitution of the equations (5) and (6) into the equation (4) gives:

$$i_R = nFk_{ox}°\cdot \exp\left(\frac{\alpha nFE}{RT}\right)C_R - nFk_{red}°\cdot \exp\left(-\frac{(1-\alpha)nFE}{RT}\right)C_O \quad (7)$$

Incidentally, when the rate of the oxidation reaction and the rate of the reduction reaction are the same and the electrode reaction is thus kinetically at equilibrium (current density $i_R=0$), the partial anode current density (A/m²) and the partial cathode current density (A/m²) have the same value. Taking this value as the exchange current density $i_0$, the following relationship is established: $i_0=i_a=-i_c$. $C_R$ and $C_O$ at equilibrium are believed to be equal to the concentrations of reactants (bulk concentrations) $C^e_R$ and $C^e_O$ in an electrolyte solution at a spot sufficiently away from a diffusion layer. Accordingly, the exchange current density $i_0$ can be represented by the following equation:

$$i_0 = nFk_{ox}°\cdot \exp\left(\frac{\alpha nFE^{eq}}{RT}\right)C^e_R = nFk_{red}°\cdot \exp\left(-\frac{(1-\alpha)nFE^{eq}}{RT}\right)C^e_O \quad (8)$$

In this equation (8), $E^{eq}$ represents the equilibrium electrode potential (i.e. onset potential of oxidation reaction), and $C^e_R$ and $C^e_O$ represent the bulk concentration of the reductant and that of the oxidant, respectively.

When the equation (7) is divided by the equation (8) and organized, the following relational equation is obtained:

$$\frac{i_R}{i_0} = \frac{C_R}{C^e_R}\cdot \exp\left(\frac{\alpha nF(E-E^{eq})}{RT}\right) - \frac{C_O}{C^e_O}\cdot \exp\left(-\frac{(1-\alpha)nF(E-E^{eq})}{RT}\right) \quad (9)$$

i.e., $$i_R = i_0\left\{\frac{C_R}{C^e_R}\cdot \exp\left(\frac{\alpha nF}{RT}\eta\right) - \frac{C_O}{C^e_O}\cdot \exp\left(-\frac{(1-\alpha)nF}{RT}\eta\right)\right\}$$

$$\eta = E - E^{eq}$$

In this equation (9), $\eta(=E-E^{eq})$ represents the overvoltage (V) of the electrode reaction.

The equation (9) pertains to an electrode reaction having a reaction order of 1. Denoting the reaction order of the oxidation reaction and that of the reduction reaction as m and l, respectively, the following relational equation is obtained:

$$i_R = i_0\left\{\left(\frac{C_R}{C^e_R}\right)^m\exp\left(\frac{\alpha nF}{RT}\eta\right) - \left(\frac{C_O}{C^e_O}\right)^l\exp\left(-\frac{(1-\alpha)nF}{RT}\eta\right)\right\} \quad (10)$$

$$\eta = E - E^{eq}$$

Such an equation that represents an exponential relationship between the overvoltage and the current density in an electrode reaction is generally referred to as "Butler-Volmer equation".

Thus far, one example of derivation of the Butler-Volmer equation for a general electrode reaction has been described. Next, the equation (10) is applied to the electrode reaction x on the positive electrode precursor in the doping method of a nonaqueous lithium power storage element according to the present disclosure. In the doping step, application of an input voltage causes the electrode reaction x to proceed in the direction of oxidation. In this case, in the early stage of the reaction, the oxidant surface concentration Co (mol/m³) can be deemed to be equal to the oxidant bulk concentration $C^e_O$ (mol/m³). In addition, when the reaction has proceeded to a certain extent and the positive electrode potential is sufficiently high, the second term in parentheses of the equation (10) is sufficiently small with respect to the first term and can thus be ignored; therefore, the oxidant surface concentration Co (mol/m³) may be assumed to remain equal to the oxidant bulk concentration $C^e_O$ (mol/m³). Consequently, the following Butler-Volmer equation can be obtained:

$$i_{Rx} = i_{0x}\left\{\left(\frac{C_{Rx}}{C^e_{Rx}}\right)^{m_x}\exp\left(\frac{\alpha_x n_x F}{RT}\eta_x\right) - \exp\left(-\frac{(1-\alpha_x)n_x F}{RT}\eta_x\right)\right\} \quad (11)$$

$$\eta_x = E - E^{eq}_x$$

In the equation (11), $i_{Rx}$ represents the current density (A/m²) of the electrode reaction x (wherein, x corresponds to 1 to N); $i_{0x}$ represents the exchange current density (A/m²) of the electrode reaction x; $C_{Rx}$ and $C^e_{Rx}$ represent the reductant surface concentration (mol/m³) and the reductant bulk concentration (mol/m³) of the electrode reaction x, respectively; $m_x$ represents the reaction order; ax represents the symmetry factor of the electrode reaction x; $n_x$ represents the valence of the electrode reaction x; F represents the Faraday constant; R represents the gas constant; T represents the temperature (K); fix represents the overvoltage (V) of the electrode reaction x; E represents the assumed positive electrode potential (V); and $E_x^{eq}$ represents the onset potential (V) of the electrode reaction x. Since a reaction rate-limiting region is in a reactant-rich state, the reductant surface concentration $C_{Rx}$ (mol/m$^3$) can be deemed to be equal to the reductant bulk concentration $C^e_{Rx}$ (mol/m$^3$).

The above-described equation (11), which is one example of the Butler-Volmer equation that can be applied in the present disclosure, may be modified as long as the exponential relationship of the overvoltage and the current density is utilized. For example, the equation (11) describes one-dimensional diffusion (linear diffusion); however, it may be expanded to two-dimensional or three-dimensional diffusion.

In order to more accurately estimate the current density using the Butler-Volmer equation, it is preferred to set required parameters in accordance with electrode reactions. For example, in order to calculate the current density $i_{Rx}$ (A/m$^2$) of an electrode reaction x (wherein, x corresponds to 1 to N) using the equation (11), the exchange current density $i_{0x}$ (A/m$^2$), the reductant surface concentration $C_{Rx}$ (mol/m$^3$), the reductant bulk concentration $C^e_{Rx}$ (mol/m$^3$), the reaction order $m_x$, the symmetry factor $\alpha_x$, the valence $n_x$, and the onset potential $E_x^{eq}$ (V) of the electrode reaction x can be set as the parameters. The temperature T (K) may also be set as a parameter, or may be a value that is actually measured from the cell outer package.

As the parameters, as long as the electrode reaction is known, known parameters of the electrode reaction can be used. When the electrode reaction itself is unknown or its parameters are unknown, the parameters may each be set in advance within a range that allows a calculated total current density to converge to a measured bulk current density.

With regard to the main reaction (electrode reaction 1) in which lithium carbonate is decomposed to release lithium ions and electrons, the onset potential $E_1^{eq}$ (V) is preferably 3.50 V or higher, 3.60 V or higher, or 3.70 V or higher, but preferably 4.40 V or lower, 4.30 V or lower, or 4.20 V or lower. The exchange current density $i_{01}$ of the main reaction is preferably 3.00E-03 A/m$^2$ or more, 3.50E-03 A/m$^2$ or more, or 4.00E-03 A/m$^2$ or more, but preferably 7.00E-03 A/m$^2$ or less, 6.50E-03 A/m$^2$ or less, or 6.00E-03 A/m$^2$ or less. The reductant surface concentration $C_{R1}$ of the main reaction is preferably 50 mol/m$^3$ or higher, 250 mol/m$^3$ or higher, or 450 mol/m$^3$ or higher, but preferably 5,000 mol/m$^3$ or lower, 3,000 mol/m$^3$ or lower, or 1,500 mol/m$^3$ or lower. The reductant bulk concentration $C^e_{R1}$ of the main reaction is preferably 100 mol/m$^3$ or higher, 300 mol/m$^3$ or higher, or 500 mol/m$^3$ or higher, but preferably 5,000 mol/m$^3$ or lower, 3,000 mol/m$^3$ or lower, or 1,500 mol/m$^3$ or lower. The reaction order $m_1$ of the main reaction is preferably an integer of 1 to 5, more preferably an integer of 1 to 3, still more preferably 1. The symmetry factor $\alpha_1$ of the main reaction is preferably 0.05 or more, 0.06 or more, or 0.07 or more, but preferably 0.15 or less, 0.12 or less, or 0.10 or less. The valence $n_1$ of the main reaction is preferably an integer of 1 to 5, more preferably an integer of 1 to 3.

For example, when the main reaction (electrode reaction 1) is assumed to be as follows, the reaction order $m_1$ is 1, the valence $n_1$ is 2, and the reductant is ethylene carbonate (EC):

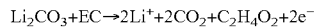

Even when a specific electrode reaction is not clear as a side reaction, it is possible to experimentally determine the ranges of parameters in which the result of calculating the total current density by setting the values of the respective parameters can converge to a measured bulk current density. From the thus experimentally determined values of the respective parameters, the type of an ongoing side reaction can be estimated as well.

With regard to side reactions (electrode reactions 2 to N), the onset potential $E_x^{eq}$ (V) is preferably 2.50 V or higher, 2.80 V or higher, or 3.00 V or higher, but preferably 4.00 V or lower, 3.70 V or lower, or 3.50 V or lower. The exchange current density $i_{0x}$ of each side reaction is preferably 0.10E-03 A/m$^2$ or more, 0.30E-03 A/m$^2$ or more, or 0.50E-03 A/m$^2$ or more, but preferably 5.00E-03 A/m$^2$ or less, 4.00E-03 A/m$^2$ or less, or 3.00E-03 A/m$^2$ or less. The reductant surface concentration $C_{Rx}$ of each side reaction is preferably 0.001 mol/m$^3$ or higher, 0.01 mol/m$^3$ or higher, or 0.1 mol/m$^3$ or higher, but preferably 1,000 mol/m$^3$ or lower, 500 mol/m$^3$ or lower, or 100 mol/m$^3$ or lower. The reductant bulk concentration $C^e_{Rx}$ of each side reaction is preferably 0.1 mol/m$^3$ or higher, 1 mol/m$^3$ or higher, or 10 mol/m$^3$ or higher, but preferably 1,000 mol/m$^3$ or lower, 500 mol/m$^3$ or lower, or 100 mol/m$^3$ or lower. The reaction order $m_x$ of each side reaction is preferably an integer of 1 to 5, more preferably an integer of 1 to 3, still more preferably 1. The symmetry factor $\alpha_x$ of each side reaction is preferably 0.10 or more, 0.15 or more, or 0.20 or more, but preferably 0.90 or less, 0.80 or less, or 0.70 or less. The valence $n_x$ of each side reaction is preferably an integer of 1 to 5, more preferably an integer of 1 to 3.

For example, when a side reaction 1 (electrode reaction 2) is assumed to be the following water splitting reaction, the reaction order $m_2$ is 1, the valence $n_2$ is 1, and the reductant is water ($H_2O$):

$$H_2O \rightarrow H^+ + \cdot OH + e^-$$

The onset potential $E_2^{eq}$ (V) of this electrode reaction 2 is preferably 3.00 V or higher, 3.10 V or higher, or 3.20 V or higher, but preferably 3.60 V or lower, 3.50 V or lower, or 3.40 V or lower. The exchange current density $i_{02}$ of the electrode reaction 2 is preferably 0.10E-03 A/m$^2$ or more, 0.30E-03 A/m$^2$ or more, or 0.50E-03 A/m$^2$ or more, but preferably 2.50E-03 A/m$^2$ or less, 2.00E-03 A/m$^2$ or less, or 1.50E-03 A/m$^2$ or less. The reductant surface concentration $C_{R2}$ of the electrode reaction 2 is preferably 0.001 mol/m$^3$ or higher, 0.01 mol/m$^3$ or higher, or 0.1 mol/m$^3$ or higher, but preferably 200 mol/m$^3$ or lower, 150 mol/m$^3$ or lower, or 100 mol/m$^3$ or lower. The reductant bulk concentration $C^e_{R2}$ of the electrode reaction 2 is preferably 10 mol/m$^3$ or higher, 15 mol/m$^3$ or higher, or 20 mol/m$^3$ or higher, but preferably 200 mol/m$^3$ or lower, 150 mol/m$^3$ or lower, or 100 mol/m$^3$ or lower. The symmetry factor $\alpha_2$ of the electrode reaction 2 is preferably 0.45 or more, 0.50 or more, or 0.55 or more, but preferably 0.75 or less, 0.70 or less, or 0.65 or less.

For example, when a side reaction 2 (electrode reaction 3) is assumed to be the following decomposition reaction of ethylene carbonate, the reaction order $m_3$ is 1, the valence $n_3$ is 1, and the reductant is ethylene carbonate (EC):

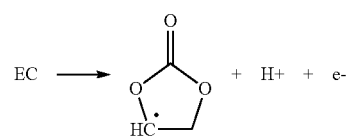

The onset potential $E_3^{eq}$ (V) of this electrode reaction 3 is preferably 3.10 V or higher, 3.20 V or higher, or 3.30 V or higher, but preferably 3.70 V or lower, 3.60 V or lower, or 3.50 V or lower. The exchange current density $i_{03}$ of the electrode reaction 3 is preferably 0.10E-03 A/m² or more, 0.30E-03 A/m² or more, or 0.50E-03 A/m² or more, but preferably 2.50E-03 A/m² or less, 2.00E-03 A/m² or less, or 1.50E-03 A/m² or less. The reductant surface concentration $C_{R3}$ of the electrode reaction 3 is preferably 0.001 mol/m³ or higher, 0.01 mol/m³ or higher, or 0.1 mol/m³ or higher, but preferably 100 mol/m³ or lower, 50 mol/m³ or lower, or 20 mol/m³ or lower. The reductant bulk concentration $C^e_{R3}$ of the electrode reaction 3 is preferably 1 mol/m³ or higher, 3 mol/m³ or higher, or 5 mol/m³ or higher, but preferably 100 mol/m³ or lower, 50 mol/m³ or lower, or 20 mol/m³ or lower. The symmetry factor $\alpha_3$ of the electrode reaction 3 is preferably 0.15 or more, 0.20 or more, or 0.25 or more, but preferably 0.45 or less, 0.40 or less, or 0.35 or less.

Regarding Standard (iii):

The standard (iii) prescribes that, in a case where the current density determined based on the above-described (ii) is equal to or higher than the limiting current density of the electrode reaction x, a current density determined by using the reductant surface concentration CR calsurated by the diffusion equation and the Butler-Volmer equation is defined as the current density $i_{Rx}$ of the electrode reaction x. Even when the electrode potential increases with the progress of an electrode reaction to a certain extent, the current density of the electrode reaction never increases beyond the limiting current density of the electrode reaction. In such a stage, the rate of the electrode reaction is limited by diffusion (mass transfer), and the current density can be calculated by the diffusion equation.

Since a reactant (reductant) of the electrode reaction x has a concentration gradient in the thickness r direction of a diffusion layer, the mass flux $Q_x$ of the reactant (reductant) is provided by the following equation according to the Fick's first law:

$$Q_x = -D_x \frac{\partial C_{Rx}}{\partial r} \tag{12}$$

In this equation (12), $Q_x$ represents the mass flux of the reductant, $C_R$ represents the reductant surface concentration (mol/m³), and r represents the diffusion layer thickness (m). $D_x$ represents the diffusion coefficient of the reductant, indicating the transfer rate of the reductant from the electrode surface to the bulk (or from the bulk to the electrode surface). $D_x$ is temperature-dependent, and can be set based on the properties of an electrolyte solution as well as the type and the like of the reductant. When position r=0 (electrode surface), the relationship between the mass flux $Q_x$ of the reactant (reductant) and the current density $i_R$ in a diffusion-limited state is connected by the Fick' laws and can be represented by the following equation:

$$Q_x = \frac{i_{Rx}}{n_x F} \tag{13}$$

In this equation (13), $n_x$ represents the valence of the electrode reaction, and F represents the Faraday constant. The following relational equation is obtained by combining the equations (12) and (13):

$$-D_x \frac{\partial C_{Rx}}{\partial r} = Q_x = \frac{i_{Rx}}{n_x F} \tag{14}$$

The temporal change ($dC_{Rx}/dt$) of the reductant surface concentration $C_{Rx}$ at a position r is provided by the following equation according to the Fick's second law:

$$\frac{\partial C_{Rx}}{\partial t} = D_x \frac{\partial^2 C_{Rx}}{\partial r^2} \tag{15}$$

In this equation (15), $C_{Rx}$ represents the reductant surface concentration (mol/m³), t represents time (s), r represents the diffusion layer thickness (m), and $D_x$ represents the diffusion coefficient of the reductant. It is noted here that, in the equation (15), $D_x$ is deemed to be constant irrespective of the position r.

Further, in a diffusion-limited state, when position r=$L_0$ (diffusion layer thickness), the reductant surface concentration $C_{Rx}$ (mol/m³) can be deemed to be equal to the reductant bulk concentration $C^e_{Rx}$ (mol/m³), i.e.

$$C_{Rx} = C^e_{Rx} \tag{16}$$

The reductant surface concentration $C_{Rx}$ in a diffusion-limited state can be determined by solving the equation (15), taking the equation (16) as the boundary condition at r=$L_0$ (diffusion layer thickness) and the equation (14) as the boundary condition at r=0 (electrode surface). Further, by substituting the thus determined reductant surface concentration $C_{Rx}$ in a diffusion-limited state into the Butler-Volmer equation (11), the current density $i_{Rx}$ (A/m²) of the electrode reaction x (wherein, x corresponds to 1 to N) in a diffusion-limited state can be determined.

The above-described equations (14) to (16), which are examples of the diffusion equation that can be applied in the present disclosure, may be modified as long as the proportional relationship of the mass flux and the concentration gradient based on the Fick's first and second laws is utilized. For example, the equations (14) to (16) describe mass transfer from the electrode surface in a Cartesian coordinate-based one-dimensional model; however, they may describe mass transfer from the reductant surface in a spherical coordinate-based one-dimensional model. Moreover, the equations (14) to (16) may be expanded to a two-dimensional model or a three-dimensional model.

In order to more accurately estimate the current density using the diffusion equation and the Butler-Volmer equation, it is preferred to set required parameters in accordance with electrode reactions. For example, in order to calculate the current density $i_{Rx}$ (A/m²) of an electrode reaction x (wherein, x corresponds to 1 to N) using the equations (14) to (16), the reductant diffusion coefficient $D_x$, the diffusion layer thickness $L_0$, the reductant bulk concentration $C^e_{Rx}$ (mol/m³), and the valence $n_x$ of the electrode reaction x can be set as the parameters. When the parameters in the diffusion equation and the parameters in the Butler-Volmer equation are redundant for a certain electrode reaction, these parameters may be different (i.e., may be set independently), or may be the same values.

As the parameters, as long as the electrode reaction is known, known parameters of the electrode reaction can be used. When the electrode reaction itself is unknown or its parameters are unknown, the parameters may each be set in advance within a range that allows a calculated total current density to converge to a measured bulk current density.

With regard to the main reaction (electrode reaction 1) in which lithium carbonate is decomposed to release lithium ions and electrons, the reductant diffusion coefficient $D_1$ is preferably 0.5E-10 m²/s or more, 1.0E-10 m²/s or more, or 1.5E-10 m²/s or more, but preferably 4.0E-10 m²/s or less, 3.0E-10 m²/s or less, or 2.0E-10 m²/s or less. The diffusion layer thickness $L_0$ of the main reaction is preferably 0.10E-04 m or more, 0.50E-04 m or more, or 0.80E-04 m or more, but preferably 2.00E-04 m or less, 1.50E-04 m or less, 1.20E-04 m or less. The reductant bulk concentration $C^e_{R1}$ (mol/m³) of the main reaction is preferably 50 mol/m³ or higher, 250 mol/m³ or higher, or 450 mol/m³ or higher, but preferably 5,000 mol/m³ or lower, 3,000 mol/m³ or lower, or 1,500 mol/m³ or lower. The valence $n_1$ of the main reaction is preferably an integer of 1 to 5, more preferably an integer of 1 to 3.

For example, when the main reaction (electrode reaction 1) is assumed to be as follows, the valence $n_1$ is 2 and the reductant is ethylene carbonate (EC):

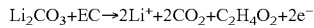

Li₂CO₃+EC→2Li⁺+2CO₂+C₂H₄O₂+2e⁻

The diffusion coefficient Di of ethylene carbonate (EC) in this electrode reaction 1 is preferably 1.0E-12 m²/s or more, 1.0E-11 m²/s or more, or 1.0E-10 m²/s or more, but preferably 1.0E-9 m²/s or less, 1.0E-8 m²/s or less, or 1.0E-7 m²/s or less.

Even when a specific electrode reaction is not clear as a side reaction, it is possible to experimentally determine the ranges of parameters in which the result of calculating the total current density by setting the values of the respective parameters can converge to a measured bulk current density. From the thus experimentally determined values of the respective parameters, the type of an ongoing side reaction can be estimated as well.

With regard to side reactions (electrode reactions 2 to N), the diffusion coefficient $D_x$ of a reductant is preferably 1.0E-16 m²/s or more, 1.0E-15 m²/s or more, or 1.0E-14 m²/s or more, but preferably 1.0E-7 m²/s or less, 1.0E-8 m²/s or less, or 1.0E-9 m²/s or less. The diffusion layer thickness Lo of each side reaction is preferably 0.10E-04 m or more, 0.50E-04 m or more, or 0.80E-04 m or more, but preferably 2.00E-04 m or less, 1.50E-04 m or less, 1.20E-04 m or less. The reductant bulk concentration $C^e_{Rx}$ (mol/m³) of each side reaction is preferably 0.1 mol/m³ or higher, 1 mol/m³ or higher, or 10 mol/m³ or higher, but preferably 2,000 mol/m³ or lower, 1,500 mol/m³ or lower, or 1,000 mol/m³ or lower. The reaction order $m_x$ of each side reaction is preferably an integer of 1 to 5, more preferably an integer of 1 to 3, still more preferably 1. The valence $n_x$ of each side reaction is preferably an integer of 1 to 5, more preferably an integer of 1 to 3.

For example, when a side reaction 1 (electrode reaction 2) is assumed to be the following water splitting reaction, the valence $n_2$ is 1 and the reductant is water (H₂O):

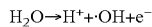

H₂O→H⁺+·OH+e⁻

The diffusion coefficient $D_2$ of water (H₂O) in this electrode reaction 2 is preferably 1.0E-13 m²/s or more, 1.0E-12 m²/s or more, or 1.0E-11 m²/s or more, but preferably 1.0E-8 m²/s or less, 1.0E-9 m²/s or less, or 1.0E-10 m²/s or less.

For example, when a side reaction 2 (electrode reaction 3) is assumed to be the following decomposition reaction of ethylene carbonate, the valence $n_3$ is 1 and the reductant is ethylene carbonate (EC):

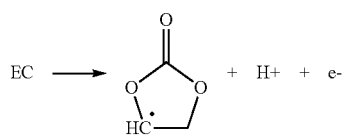

The diffusion coefficient $D_3$ of ethylene carbonate (EC) in this electrode reaction 3 is preferably 1.0E-16 m²/s or more, 1.0E-15 m²/s or more, or 1.0E-14 m²/s or more, but preferably 1.0E-11 m²/s or less, 1.0E-12 m²/s or less, or 1.0E-13 m²/s or less.

<Positive Electrode Potential Correction Step>

The positive electrode potential correction step (S4) is the step of correcting the assumed positive electrode potential E (V) such that a total current density of the capacitor current density $i_C$ and the current densities $i_R$ (A/m²) is equal to the bulk current density, and thereby obtaining a corrected positive electrode potential E (V) (hereinafter, also simply referred to as "corrected positive electrode potential"). The bulk current density at the time of its measurement can be separated into the capacitor current density $i_C$ and the respective current density $i_R$ (A/m²) components. This enables to estimate the extent of the progress of the main reaction and side reactions at the time of the measurement. The positive electrode potential correction step can be performed using an information processing apparatus in the same manner as the current density calculation step.

When there is no corrected positive electrode potential at which the total current density is equal to the bulk current density, the parameter values of the Butler-Volmer equation and the diffusion equation can be modified. In the method of the present disclosure, it is preferred to use parameters that are set in advance such that such a corrected positive electrode potential exists.

<Current Separation Step>

The current separation step (S5) is the step of repeating the current density calculation step and the positive electrode potential correction step while modifying the system time such that the total current density converges to the bulk current density i (A/m²). In other words, not only the bulk current density can be separated into the capacitor current density is and the respective current density $i_R$ (A/m²) components over a certain time range, but also information regarding the behavior (change) of the corrected positive electrode potential in the time range can be obtained. This enables to estimate the timing and the extent of the progress of the main reaction and side reactions in the time range. The current separation step can be performed using an information processing apparatus in the same manner as the current density calculation step and the positive electrode potential correction step.

When the total current density does not converge to the bulk current density, the parameter values of the Butler-Volmer equation and the diffusion equation can be modified. In the method of the present disclosure, it is preferred to use parameters that are set in advance such that the total current density converges to the bulk current density over the period from the start of doping to the completion of doping in which the method of the present disclosure is applied (target period). For example, when constant-current charging is initially performed and followed by low-voltage charging in the doping step, it is more preferred that the parameters of the Butler-Volmer equation and the diffusion equation be set in advance such that the total current density converges to the bulk current density throughout the constant-current charging process.

<Doping Condition Modification Step>

The doping method of the present disclosure may further include the doping condition modification step (S6) as desired (FIG. 2). The doping condition modification step (S6) is the step of modifying the doping conditions set in the doping condition setting step such that a difference between the behavior of the corrected positive electrode potential E (V) obtained in the current separation step and the behavior of the measured positive electrode potential E (V) is small. The thus modified doping conditions can be utilized in the subsequent doping of a nonaqueous lithium power storage element. This enables to more accurately estimate the status of the progress of the main reaction and side reactions. The doping condition modification step can be performed by feeding back the results of calculation performed by the information processing apparatus to the condition adjustment devices such as a cell charge-discharge device, a temperature regulator, and a pressure regulator. The doping conditions do not have to be modified as long as the difference between the behavior of the corrected positive electrode potential E (V) obtained in the current separation step and the behavior of the measured positive electrode potential E (V) is within a threshold value.

<Doping Condition Control Step>

The doping method of the present disclosure preferably further includes the step (S6) of controlling the doping conditions in the step (1) such that a difference between the behavior of the corrected positive electrode potential E obtained in the current separation step and the behavior of a target positive electrode potential E is small during doping (FIG. 2). This enables to more appropriately control the doping conditions in real time. The doping condition modification step can be performed by feeding back the results of calculation performed by the information processing apparatus to the condition adjustment devices such as a cell charge-discharge device, a temperature regulator, and a pressure regulator. The doping conditions do not have to be modified as long as the difference between the behavior of the corrected positive electrode potential E (V) obtained in the current separation step and the behavior of the target positive electrode potential E (V) is within a threshold value.

As described above, examples of the doping conditions include cell temperature (° C.), input voltage (V), bulk current (A), bulk current density (A/m$^2$), and cell pressure (kgf/cm$^2$). Preferred ranges in which these doping conditions can be modified are the same as the preferred ranges relating to the corresponding conditions in the doping condition setting step. In other words, the cell temperature is modified within a range of preferably 25° C. or higher, 30° C. or higher, or 35° C. or higher, but preferably 70° C. or lower, 65° C. or lower, 60° C. or lower, or 55° C. or lower. The input voltage is modified within a range of preferably 4.0 V or more, 4.2 V or more, or 4.4 V or more, but preferably 5.0 V or less, 4.8 V or less, or 4.6 V or less. The bulk current is modified within a range of preferably 1 C or more, 5 C or more, or 10 C or more, but 100 C or less, 50 C or less, 40 C or less, or 30 C or less. The bulk current density is modified within a range of preferably 2.5 A/m$^2$ or higher, 3.0 A/m$^2$ or higher, or 3.5 A/m$^2$ or higher, but 5.0 A/m$^2$ or lower, 4.5 A/m$^2$ or lower, or 4.0 A/m$^2$ or lower. Further, the cell pressure is modified within a range of preferably 0.1 kgf/cm$^2$ or higher, 0.5 kgf/cm$^2$ or higher, or 1 kgf/cm$^2$ or higher, but 1,000 kgf/cm$^2$ or lower, 100 kgf/cm$^2$ or lower, or 10 kgf/cm$^2$ or lower.

The "behavior" of positive electrode potential refers to temporal change of the positive electrode potential, and examples thereof include time differentiation of a time-positive electrode potential model function (dE/dt) and positive electrode potential differentiation of an integrated current value Q (Ah) of the bulk current density applied to the cell (dQ/dE). As a more specific method of modifying the doping conditions, for example, when the behavior of the corrected positive electrode potential deviates from the behavior of the measured positive electrode potential in the positive direction, their difference tends to be reduced by raising the cell temperature, increasing the cell-restraining pressure, or reducing the bulk current density. When the behavior of the corrected positive electrode potential deviates from the behavior of the measured positive electrode potential in the negative direction, their difference tends to be reduced by lowering the cell temperature, reducing the cell-restraining pressure, or increasing the bulk current density. However, in the case of increasing or reducing the bulk current density, it is preferred to compare the positive electrode potential differentiation of the integrated current value (dQ/dE).

<Termination of Method>

Once current separation is completed over a period in which the method of the present disclosure is applied (target period), the current separation by the doping method of the present disclosure can be terminated. The current separation by the doping method of the present disclosure may be performed, for example, over the entire period from the start of doping to the completion of doping, the entire period from the start of doping to the constant-current charging, or over a portion of the period from the start of doping to the constant-current charging. It is noted here that the doping of nonaqueous lithium power storage element may be continued further even after the end of the target period.

<Processing After Doping Step>

After the completion of the doping step, as required, the charge-discharge cycle step, the high-temperature aging step, the degassing and sealing step, and the like are performed, whereby a nonaqueous lithium power storage element can be produced.

<<Doping Apparatus of Nonaqueous Lithium Power Storage Element>>

The doping apparatus of the present disclosure includes the following control units: (1) a doping condition setting unit; (2) a measurement unit; (3) a control unit which calculates the capacitor current density and the current density of each electrode reaction based on an assumed positive electrode potential; (4) a control unit which corrects the assumed positive electrode potential based on a bulk current density; and (5) a current separation unit which repeats the controls performed by the control units (3) and (4) while modifying the system time. In other words, the doping apparatus of the present disclosure, focusing on the side of the positive electrode precursor between the positive electrode precursor and the negative electrode, mathematically separates the bulk current density (current density of whole cell) in the doping step into current densities of plural electrode reactions assumed to occur on the positive electrode precursor. This enables to estimate the status of the progress of at least a main reaction (lithium carbonate decomposition reaction). For example, the state of the main reaction among the plural electrode reactions can be estimated, including how dominant the progress of the main reaction is (or was) and quantitatively how much of the main reaction has been (or was) completed. The estimated status of the progress of the main reaction can be utilized for, for example, management, prediction, or improvement of the performance of the resulting nonaqueous lithium power storage element. The doping apparatus of the present disclosure preferably further includes (6) a doping condition control unit which controls doping conditions such that the difference in behavior between a corrected positive electrode potential and a target positive electrode potential E is small during control of doping.

The doping system of the present disclosure includes: the above-described control apparatus; an adjustment apparatus which adjusts the cell temperature and the input voltage based on signals from the control apparatus; and a measurement apparatus which acquires information regarding the positive electrode potential E (V) and the bulk current density i (A/m$^2$) of the cell, and transmits signals relating to the thus acquired information to the control apparatus.

Figure 3:
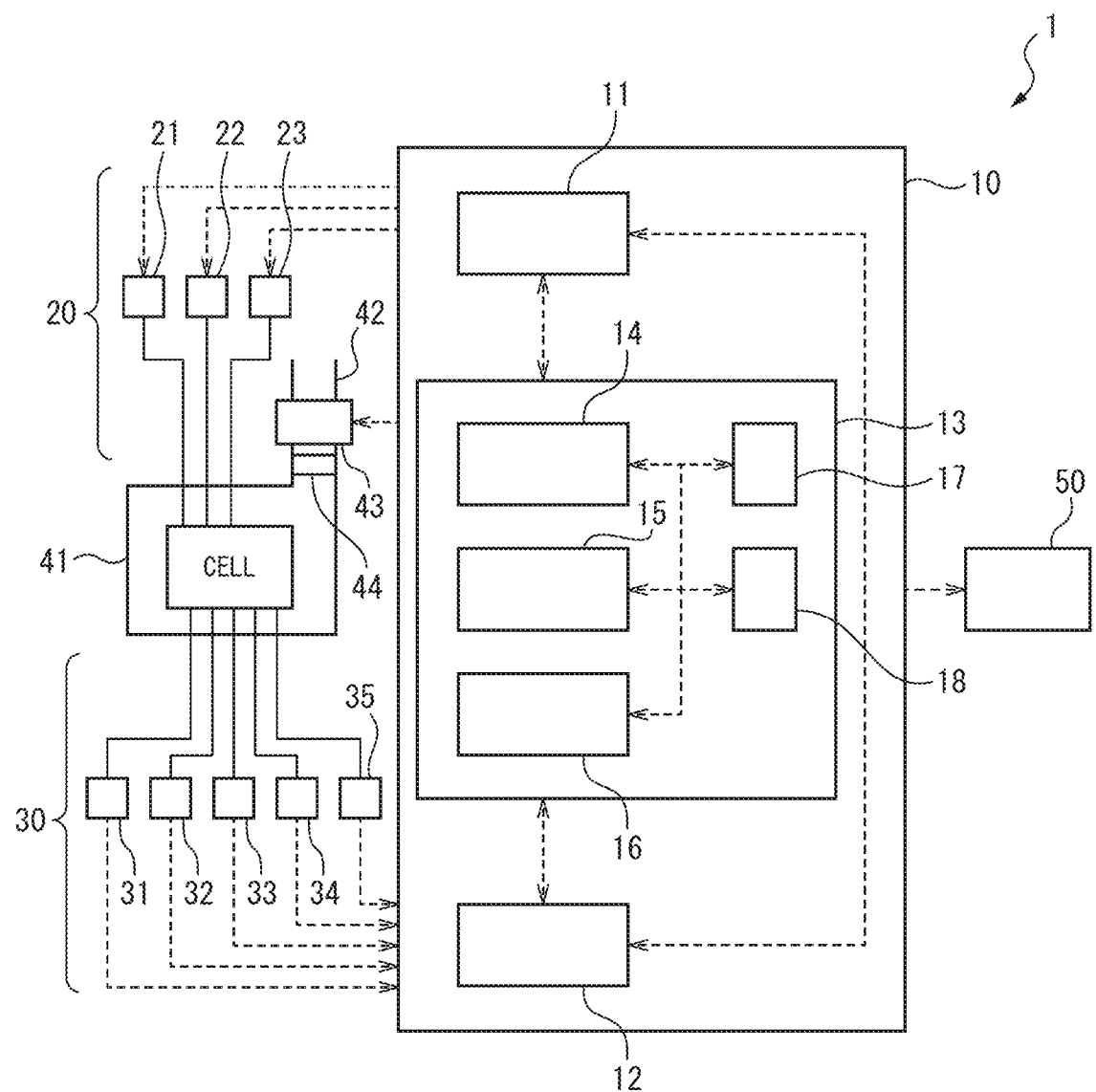
FIG. 3 is a block diagram illustrating one example of the doping apparatus of a nonaqueous lithium power storage element according to the present disclosure.
Figure 4:
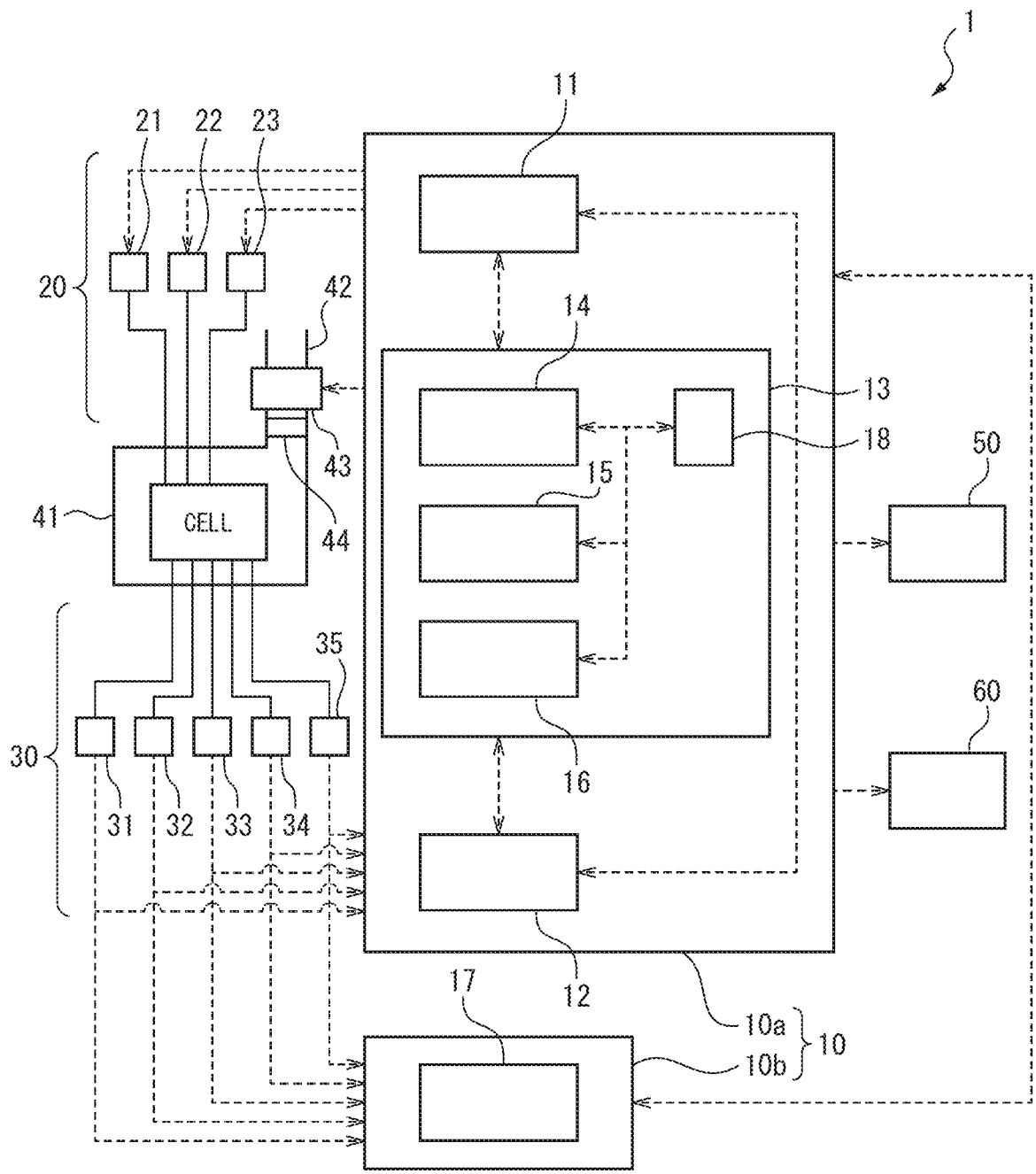
FIG. 4 is a block diagram illustrating another example of the doping apparatus of a nonaqueous lithium power storage element according to the present disclosure.

FIGS. 3 and 4 are each a block diagram that illustrates a configuration example of a doping system 1 of a nonaqueous lithium power storage element according to the present disclosure. FIGS. 1 and 2 are each a flow chart that describes the doping method of a nonaqueous lithium power storage element according to the present disclosure. Each unit will now be described referring to the symbols used in these figures; however, the contents of the present disclosure are not limited to the modes of these figures. The doping system 1 illustrated in FIGS. 3 and 4 includes a control apparatus 10, an adjustment apparatus 20, and a measurement apparatus 30. Thereamong, the control apparatus 10 includes a doping condition setting unit 11, a measurement unit 12, and an information processing unit 13. Specifically, each control unit is realized by execution of a program by a microcomputer. At least a portion of the control apparatus 10 may be physically isolated from other apparatuses and, for example, may exist in the cloud. Conversely, at least a portion of the control apparatus 10 may be configured to be physically integrated with at least one of other apparatuses. One control unit may be configured to be independent from other control units, or may be configured to be integrated with other control units.

<Doping Condition Setting Unit>

The doping condition setting unit 11 performs a control relating to the doping condition setting step (S1) based on signals from the respective control units. The doping condition setting step (S1) is the step of setting doping conditions including cell temperature (° C.) and input voltage (V). Examples of the doping conditions include bulk current (A), bulk current density (A/m$^2$), and cell pressure (kgf/cm$^2$), in addition to cell temperature (° C.) and input voltage (V). The adjustment apparatus 20, which adjusts the cell temperature and the input voltage, is controlled based on signals from the doping condition setting unit 11. The adjustment apparatus 20 may further control the cell pressure based on signals from the doping condition setting unit 11. The adjustment apparatus 20 includes, for example, a charge-discharge device 21, a temperature regulator 22, and a pressure regulator 23, which are connected to the cell. The adjustment apparatus 20 is connected to the control apparatus 10 via a wire or wirelessly.

<Measurement Unit>

The measurement unit 12 performs a control relating to the measurement step (S2) based on signals from the respective control units. The measurement step (S2) is the step of measuring the positive electrode potential E (V) and the bulk current density i (A/m$^2$) of the cell while applying the input voltage to the cell. By applying the input voltage, lithium carbonate existing in the positive electrode precursor is decomposed to release lithium ions, and the negative electrode active material can be doped with the lithium ions. In the measurement step, for example, the cell temperature (° C.) and the cell pressure (kgf/cm$^2$) can also be measured in addition to the positive electrode potential and the bulk current density of the cell. These physical properties can be measured using the measurement apparatus 30 which includes, for example, a voltage line 31, a reference electrode 32, a current line 33, a thermocouple 34, and a pressure gauge 35 that are connected to the respective measurement spots of the cell as required. Information regarding the positive electrode potential E (V) of the cell, the bulk current density i (A/m$^2$), the cell temperature (° C.), and the cell pressure (kgf/cm$^2$) are acquired by the measurement apparatus 30. Further, the measurement apparatus 30 transmits signals relating to the thus acquired information to the measurement unit 12. The measurement apparatus 30 is connected to the control apparatus 10 via a wire or wirelessly.

<Current Density Calculation Unit>

A current density calculation unit 14 performs a control relating to the current density calculation step (S3) based on signals from the respective control units. The current density calculation step (S3) is the step of assuming the positive electrode potential E (V) when the system time is modified by Δt at the time of the above-described measurement and, based on this assumption, calculating the capacitor current density $i_C$ (A/m$^2$) of the cell and the current densities $i_{R1}$ (A/m$^2$) to $i_{RN}$ (A/m$^2$) of the respective assumed N kinds of electrode reactions. The positive electrode potential assumed in the current density calculation step is hereinafter referred to as "assumed positive electrode potential". The current density calculation step can be performed by the information processing unit 13 included in an information processing apparatus (control apparatus 10: computer) connected to external devices such as a cell condition adjustment apparatus (adjustment apparatus 20) and the measurement apparatus (30). The information processing unit 13 includes the current density calculation unit 14, a positive electrode potential correction unit 15, and a current separation unit 16. Further, the information processing unit 13 includes: a memory unit (not illustrated) which stores, for example, programs for executing current density calculation and the like, parameters, measurement data, and calculation results; and an arithmetic unit (not illustrated) which performs current density calculation and the like. The programs allows the information processing unit 13 to execute information processing in the doping method of the present disclosure, such as current density calculation, positive electrode potential correction, and current separation.

<Positive Electrode Potential Correction Unit>

The positive electrode potential correction unit 15 performs a control relating to the positive electrode potential correction step (S4) based on signals from the respective control units. The positive electrode potential correction step (S4) is the step of correcting the assumed positive electrode potential E (V) such that a total current density of the capacitor current density $i_C$ and the current densities $i_R$ (A/m$^2$) is equal to the bulk current density, and thereby obtaining a corrected positive electrode potential E (V) (hereinafter, also simply referred to as "corrected positive electrode potential"). The bulk current density at the time of its measurement can be separated into the capacitor current density $i_C$ and the respective current density $i_R$ (A/m$^2$) components. This enables to estimate the extent of the progress of the main reaction and side reactions at the time of the measurement. The positive electrode potential correction step is controlled by the information processing unit 13 and the like in the same manner as the current density calculation step.

<Current Separation Unit>

The current separation unit 16 performs a control relating to the current separation step (S5) based on signals from the respective control units. The current separation step (S5) is the step of repeating the current density calculation step and the positive electrode potential correction step while modifying the system time such that the total current density converges to the bulk current density i (A/m$^2$). In other words, not only the bulk current density can be separated into the capacitor current density is and the respective current density $i_R$ (A/m$^2$) components over a certain time range, but also information regarding the behavior (change) of the corrected positive electrode potential in the time range can be obtained. This enables to estimate the timing and the extent of the progress of the main reaction and side reactions in the time range. The current separation step is controlled by the information processing unit 13 and the like in the same manner as the current density calculation step and the positive electrode potential correction step.

<Doping Condition Modification Unit>

The doping apparatus 10 of the present disclosure may further include a doping condition modification unit 17 as desired (FIG. 3). The doping condition modification unit 17 performs a control relating to the doping condition modification step (S6) based on signals from the respective control units. The doping condition modification step (S6) is the step of modifying the doping conditions set in the doping condition setting step such that a difference between the behavior of the corrected positive electrode potential E (V) obtained in the current separation step and the behavior of the measured positive electrode potential E (V) is small. The thus modified doping conditions can be utilized in the subsequent doping of a nonaqueous lithium power storage element. This enables to more accurately estimate the status of the progress of the main reaction and side reactions. The doping condition modification step can be performed by feeding back the results of calculation performed by the information processing apparatus (control apparatus 10) to the condition adjustment devices (adjustment apparatus 20) such as the cell charge-discharge device 21, the temperature regulator 22, and the pressure regulator 23. The doping conditions do not have to be modified as long as the difference between the behavior of the corrected positive electrode potential E (V) obtained in the current separation step and the behavior of the measured positive electrode potential E (V) is within a threshold value.

<Doping Condition Control Unit>

The doping apparatus 10 of the present disclosure may further include a doping condition control unit 17 as desired (FIG. 4). The doping condition control unit 17 performs a control relating to the below-described step (S6) based on signals from the respective control units. In the step (S6), the doping conditions set by the control unit (1) are controlled such that a difference between the behavior of the corrected positive electrode potential E obtained from the current separation unit and the behavior of a target positive electrode potential E is small during doping. This enables to more appropriately control the doping conditions in real time. The step (S6) can be performed by feeding back the results of calculation performed by the information processing apparatus (control apparatus 10) to the condition adjustment devices (adjustment apparatus 20) such as the cell charge-discharge device 21, the temperature regulator 22, and the pressure regulator 23. The doping conditions do not have to be modified as long as the difference between the behavior of the corrected positive electrode potential E (V) obtained in the current separation step and the behavior of the measured positive electrode potential E (V) is within a threshold value.

The doping condition control unit 17 may be configured to be separate from other control units 11 to 16 (FIG. 4). In other words, the doping condition control unit 17 may be included in a control apparatus different from the control apparatus that includes the other control units 11 to 16. In the doping system 1 illustrated in FIG. 4, the control apparatus 10 is constituted by a first control apparatus 10a and a second control apparatus 10b that are separate from each other, and the first control apparatus 10a includes the control units 11 to 16 while the second control apparatus 10b includes the doping condition control unit 17. The second control apparatus 10b is connected to the first control apparatus 10a via a wire or wirelessly. In addition, the second control apparatus 10b is connected to the measurement apparatus 30 via a wire or wirelessly, whereby information regarding the cell measurement results are directly input to the second control apparatus 10b. In other words, in the doping system 1, the second control apparatus 10b having a real-time control function is separated from the first control apparatus 10a. This enables to simply and easily impart a real-time control function to the first control apparatus 10a with the connection of the second control apparatus 10b. For example, when the first control apparatus 10a is configured as a general personal computer or exists in the cloud, it is one of preferred modes of the doping system 1 that the second control apparatus 10b, which may be configured as a personal computer dedicated to real-time control, can be separately managed and operated. However, the second control apparatus 10b may configured to be integrated with the first control apparatus 10a as well. Further, even when the second control apparatus 10b and the first control apparatus 10a are configured to be separate from each other, the second control apparatus 10b may acquire information regarding the cell measurement results via the first control apparatus 10a.

<Exhaust Gas Flow Rate Adjustment Unit>

The doping apparatus 10 of the present disclosure may further include an exhaust gas flow rate adjustment unit 18 as desired (FIGS. 3 and 4). The exhaust gas flow rate adjustment unit 18 performs a control relating to the exhaust gas flow rate adjusting step (not included in the flow charts) based on signals from the respective control units. In the exhaust gas flow rate adjusting step, the flow rate of gas generated from the cell inside a doping/aging bath 41 and discharged into the atmosphere is adjusted. The gas generated from the cell flows inside a vent pipe 42 connected to the doping/aging bath 41 through a flow rate adjustment device 43 and is discharged into the atmosphere. The operation of the flow rate adjustment device 43 is controlled based on signals from the exhaust gas flow rate adjustment unit 18. The flow rate adjustment device 43 is, for example, an exhaust fan or an exhaust valve. When the flow rate adjustment device 43 is an exhaust fan, the exhaust gas flow rate adjustment unit 18 can control the rotation speed of the exhaust fan, whereas when the flow rate adjustment device 43 is an exhaust valve, the exhaust gas flow rate adjustment unit 18 can control the opening area of the exhaust valve. The exhaust gas flow rate adjustment unit 18 is connected to the control apparatus 10 via a wire or wirelessly. In the vent pipe 42, one or more filters 44 for capturing a gas component originating from a volatile solvent may be arranged in the upstream or downstream, preferably in the upstream, of the flow rate adjustment device 43.

The doping system 1 of the present disclosure may further include a display device 50 which displays information regarding the status of the progress of at least one electrode reaction in the doping step (FIGS. 3 and 4). The "information regarding the status of the progress of at least one electrode reaction in the doping step" refers to, for example, information shown in FIGS. 5 to 9 (described below). By this, the status of the progress of the controls performed by the control apparatus 10, which is shown in FIGS. 5 to 9, can be visually and more easily grasped. The display device 50 and the control apparatus 10 are connected via a wire or wirelessly. The display device 50 may be a mobile terminal, such as a smartphone, a smart watch, or a laptop computer. In response to the results of analysis performed by the doping condition control unit 17, the control apparatus 10 may present on the display device 50 various performance predictions and/or preferred candidates for various control conditions in real-time control.

The doping system 1 of the present disclosure may further include a warning device 60 which can issue a warning in accordance with the contents of the control performed by the doping condition control unit 17 (FIG. 4). The "control performed by the doping condition control unit 17" is, for example, real-time control in the doping step that is performed by the control apparatus 10. The control apparatus 10 monitors the present value and the amount of change for the cell temperature (° C.), the cell pressure (kgf/cm$^2$), the cell positive electrode potential E (V), the bulk current density i (A/m$^2$), and the operating amount of the flow rate adjustment device 43, all of which constantly vary in real-time control. When any present value exceeded a prescribed value and/or the amount of change exceeded a prescribed value, the control apparatus 10 outputs a signal to the warning device 60 to issue a warning. The warning may be, for example, an alarm. Further, when the warning device 60 has a display unit, the warning may be a warning screen displayed on the display unit. When the warning device 60 is configured to be integrated with the display device 50, the warning may be a warning screen displayed on the display device 50.

<<Nonaqueous Lithium Power Storage Element>>

The nonaqueous lithium power storage element, which is the subject of the doping method of the present disclosure, is a nonaqueous lithium power storage element that includes a cell including: a positive electrode precursor that includes a positive electrode active material layer containing lithium carbonate and activated carbon; a negative electrode that includes a negative electrode active material layer containing a negative electrode active material capable of occluding and releasing lithium; a separator arranged between the positive electrode precursor and the negative electrode; and an electrolyte solution.

<Positive Electrode Precursor>

The positive electrode precursor includes a positive electrode active material layer containing lithium carbonate and activated carbon. The term "positive electrode precursor" used herein refers to a positive electrode on which the doping step has not been completed. The positive electrode active material layer may also contain a positive electrode active material other than lithium carbonate and activated carbon, for example, carbon nanotubes, graphene, graphene oxide, a conductive polymer, a porous carbon material (excluding activated carbon), or a composite oxide of lithium (Li) and a transition metal (lithium-transition metal oxide). The positive electrode active material layer may further contain, as required, optional components such as a conductive filler, a binder, a dispersion stabilizer, and a pH modifier.

The positive electrode active material layer is typically formed on a positive electrode current collector. The positive electrode current collector is preferably a metal foil which has a high electron conductivity and is unlikely to be deteriorated due to, for example, elution into an electrolyte solution or reaction with an electrolyte or ion, more preferably an aluminum foil.

<Negative Electrode>

The negative electrode includes a negative electrode active material layer containing a negative electrode active material capable of occluding and releasing lithium. Examples of the negative electrode active material include carbon materials, titanium oxide, silicon, silicon oxide, silicon alloys, silicon compounds, tin, and tin compounds, and the negative electrode active material is preferably a carbon material, more preferably activated carbon. The negative electrode active material layer may also contain, as required, optional components such as a conductive filler, a binder, and a dispersant.

The negative electrode active material layer is typically formed on a negative electrode current collector. The negative electrode current collector is preferably a metal foil which has a high electron conductivity and is unlikely to be deteriorated due to, for example, elution into an electrolyte solution or reaction with an electrolyte or ion, more preferably a copper foil.

<Separator>

The separator is arranged between the positive electrode precursor and the negative electrode. Examples of a material of the separator include polyolefins, celluloses, and aramid resins. The separator is preferably one which includes a polyolefin microporous membrane. Examples of the polyolefin contained in the polyolefin microporous membrane include polyethylene and polypropylene.

<Electrolyte Solution>

The electrolyte solution is preferably a nonaqueous electrolyte solution which contains an electrolyte and a nonaqueous solvent. From the standpoint of obtaining a high conductivity, the electrolyte is preferably an alkali metal salt, more preferably a lithium salt.

From the standpoint of obtaining a high conductivity, the lithium salt is, for example, (LiN(SO$_2$F)$_2$), LiN(SO$_2$CF$_3$)$_2$, LiN(SO$_2$C$_2$F$_5$)$_2$, LiN(SO$_2$CF$_3$)(SO$_2$C$_2$F$_5$), LiN(SO$_2$CF$_3$)(SO$_2$C$_2$F$_4$H), LiC(SO$_2$F)$_3$, LiC(SO$_2$CF$_3$)$_3$, LiC(SO$_2$C$_2$F$_5$)$_3$, LiCF$_3$SO$_3$, LiC$_4$F$_9$SO$_3$, LiPF$_6$, or LiBF$_4$. The lithium salt is more preferably at least one selected from the group consisting of LiPF$_6$, LiN(SO$_2$F)$_2$, and LiBF$_4$. These lithium salts may be used singly, or in combination of two or more thereof.

The nonaqueous solvent is, for example, a chain carbonate or a cyclic carbonate. Examples of the chain carbonate include dialkyl carbonates, such as dimethyl carbonate (DMC), ethyl methyl carbonate (EMC), diethyl carbonate (DEC), dipropyl carbonate, and dibutyl carbonate. Examples of the cyclic carbonate include alkylene carbonates, such as ethylene carbonate (EC), propylene carbonate (PC), butylene carbonate, vinylene carbonate, and fluoroethylene carbonate. From the standpoint of dissolving the electrolyte in a desired amount and allowing a high lithium ion conductivity to be exerted, the nonaqueous solvent is preferably a cyclic carbonate, more preferably ethylene carbonate (EC).

The electrolyte solution may also contain, as required, additives such as a sulfur-containing compound, a phosphoric acid ester compound, an acyclic fluorine-containing ether, a cyclic phosphazene, a fluorine-containing cyclic carbonate, a cyclic carbonic acid ester, a cyclic carboxylic acid ester, and a cyclic acid anhydride.

<Outer Package>

The nonaqueous lithium power storage element is typically housed in an outer package typified by a metal can or a laminated packaging material. As a method of sealing the outer package, for example, heat sealing or impulse sealing may be employed when a laminated packaging material is used.

EXAMPLES

<Production of Cell (Element Precursor)>

A cell (element precursor) to be used as a subject of the doping step was produced as follows.

[Production of Negative Electrode]

A mixture having a solid weight ratio of 39.0 wt % was obtained by mixing 83.0 wt % of artificial graphite, 13.0 wt % of carbon black, 2.0 wt % of carboxymethyl cellulose (CMC) as a dispersant, 2.0 wt % of a styrene-butadiene copolymer, and distilled water. The thus obtained mixture was dispersed using a planetary centrifugal mixer to prepare a negative electrode coating liquid. This negative electrode coating liquid was applied to one side of an electrolytic copper foil using a doctor blade and subsequently dried to produce a negative electrode.

[Production of Positive Electrode Precursor]

A mixture having a solid weight ratio of 34.1 wt % was obtained by mixing 53.8 wt % of activated carbon, 1.4 wt % of carboxymethyl cellulose (CMC), 34.1 wt % of lithium carbonate, 4.0 wt % of carbon black, 3.8 wt % of acrylic latex (LTX), 2.9 wt % of polyvinylpyrrolidone (PVP), and distilled water. The thus obtained mixture was dispersed using a planetary centrifugal mixer to prepare a positive electrode coating liquid. This positive electrode coating liquid was applied to one side of an aluminum foil using a doctor blade and subsequently dried. Thereafter, this aluminum foil was pressed using a roll press to produce a positive electrode precursor.

[Preparation of Electrolyte Solution]

Using a mixed solvent of ethylene carbonate (EC) and ethyl methyl carbonate (EMC) (EC:EMC=33:67 (volume ratio)) as an organic solvent, electrolyte salts were dissolved therein such that $LiPF_6$ and LiFSI had a concentration ratio of 1:1 and a total concentration of 1.2 mol/L, whereby a nonaqueous electrolyte solution 1-1 was obtained.

[Assembly Step]

A single piece was cut out from the above-obtained positive electrode precursor such that its positive electrode active material layer had a size of 4.4 cm×9.4 cm. Subsequently, a single piece was cut out from the above-obtained negative electrode such that its negative electrode active material layer had a size of 4.5 cm×9.5 cm. Further, a 4.7 cm×9.8 cm polyethylene separator (manufactured by Asahi Kasei Corporation, thickness: 15 μm) was prepared. These were disposed in layers in the order of the positive electrode precursor, the separator, and the negative electrode such that the positive electrode active material layer and the negative electrode active material layer face each other via the separator, whereby an electrode laminate was obtained. A positive electrode terminal and a negative electrode terminal were ultrasonically welded to the thus obtained electrode laminate, and this electrode laminate was put into an outer package formed of an aluminum laminated packaging material, followed by heat-sealing of three sides including the electrode terminals.

[Injection, Impregnation, and Sealing Steps]

Under the atmospheric pressure in a dry-air environment having a temperature of 25° C. and a dew point of −40° C. or lower, about 2.5 g of the nonaqueous electrolyte solution was injected into the outer package housing the electrode laminate. After the injection of the nonaqueous electrolyte solution, the electrode laminate was placed in a vacuum chamber, and an operation of reducing the pressure from the atmospheric pressure and then restoring the atmospheric pressure was repeated to impregnate the electrode laminate with the nonaqueous electrolyte solution. Thereafter, the electrode laminate was placed in a vacuum sealing machine and sealed under reduced pressure, whereby the outer package was sealed to obtain a cell (element precursor).

<Example of Doping Method>

The cell temperature and the input current were set at 45° C. and 50 mA, respectively, and doping was started. The bulk current flowing in the whole cell in the doping step was found to be 50 mA when measured while applying the input voltage to the cell. Conversion of this value into the bulk current density i yielded a value of 12.1 A/m². Further, the cell pressure during the doping step was 0.16 kgf/cm². In this Example, under the above-described conditions, doping was started with constant-current charging and, once the voltage reached 4.5 V, the constant-current charging was switched to constant-voltage charging, after which doping was performed for another 2.5 hours.

Three reactions of a main reaction, a side reaction 1, and a side reaction 2 were assumed as electrode reactions. The main reaction was assumed to be a decomposition reaction of lithium carbonate in the presence of solvents (ethylene carbonate and ethyl methyl carbonate): $Li_2CO_3$+solvents→$2Li^+$+$2CO_2$+$C_xH_yO_z$+$2e^-$. For this main reaction, parameters were set as follows: exchange current density $i_{01}$=5.00E-03 A/m², diffusion layer thickness $L_0$=1.00E-04 m, reductant bulk concentration $C^e_{R1}$=1,000 mol/m³, reaction order $m_1$=1, symmetry factor $\alpha_1$=0.087, valence $n_1$=2, onset potential $E_1^{eq}$=3.85 V, and diffusion coefficient $D_1$=1.6E-10 m²/s.

The side reaction 1 was assumed to be a water splitting reaction: $H_2O$→$H^+$+·OH+$e^-$. For this side reaction 1, parameters were set as follows: exchange current density $i_{02}$=1.00E-03 A/m², diffusion layer thickness $L_0$=1.00E-04 m, reductant bulk concentration $C^e_{R2}$=40 mol/m³, reaction order $m_2$=1, symmetry factor $\alpha_2$=0.6, valence $n_2$=1, onset potential $E_2^{eq}$=3.3 V, and diffusion coefficient $D_2$=1.1E-10 m²/s.

The side reaction 2 was assumed to be a decomposition reaction of the electrolyte solution solvent (solvent→(solvent**)+$H^+$+$e^-$. For this side reaction 2, parameters were set as follows: exchange current density $i_{03}$=1.00E-03 A/m², diffusion layer thickness $L_0$=1.00E-04 m, reductant bulk concentration $C^e_{R3}$=10 mol/m³, reaction order $m_3$=1, symmetry factor $\alpha_3$=0.3, valence $n_3$=1, onset potential $E_3^{eq}$=3.4 V, and diffusion coefficient $D_3$=1.1E-10 m²/s. The set values of these parameters are summarized in Table 1 below.

TABLE 1

| | | | | | | |
|---|---|---|---|---|---|---|
| | | Set Values of Parameters | | | | |
| Item | Symbol | Unit | Capacitor | Main reaction | Side reaction 1 | Side reaction 2 |
| Onset potential | $E^{eq}$ | V | 3.3 | 3.85 | 3.3 | 3.4 |
| Capacitor capacity | C | F/m² | 2,800 | — | — | — |
| Initial amount | $W_0$ | mol/m²-cell | — | 0.27778 | 0.00278 | 0.00278 |

TABLE 1-continued

Set Values of Parameters

| Item | Symbol | Unit | Capacitor | Main reaction | Side reaction 1 | Side reaction 2 |
|---|---|---|---|---|---|---|
| Reductant bulk concentration | $C^eR$ | mol/m$^3$ | — | 1,000 | 40 | 10 |
| Diffusion coefficient | D | m$^2$/s | — | 1.6E–10 | 1.1E–10 | 1.1E–10 |
| Exchange current density | $i_0$ | A/m$^2$ | — | 5.00E–03 | 1.00E–03 | 1.00E–03 |
| Valence | n | — | — | 2 | 1 | 1 |
| Symmetry factor | α | — | — | 0.087 | 0.6 | 0.3 |
| Diffusion layer thickness | $L_0$ | m | — | 1.00E–04 | 1.00E–04 | 1.00E–04 |
| Reaction order | m | — | — | 1 | 1 | 1 |

The initial amount $W_0$ is the amount of a main substance added for each reaction (Li carbonate for the main reaction; water or the like for the side reactions).

Figure 5:
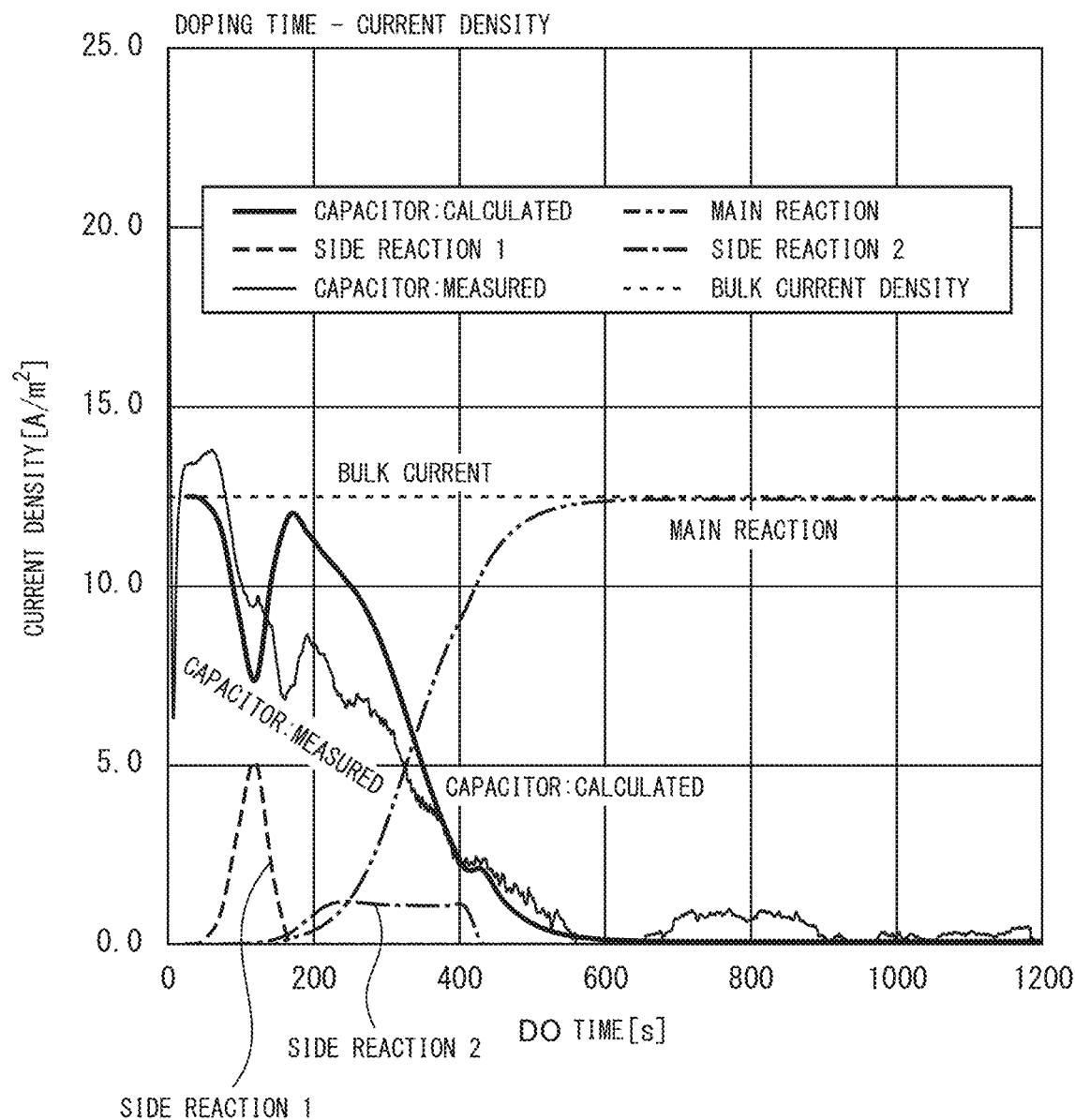
FIG. 5 is a graph showing the relationship between the doping time (s) and the current density ($A/m^2$) in Example of the doping method.
Figure 6:
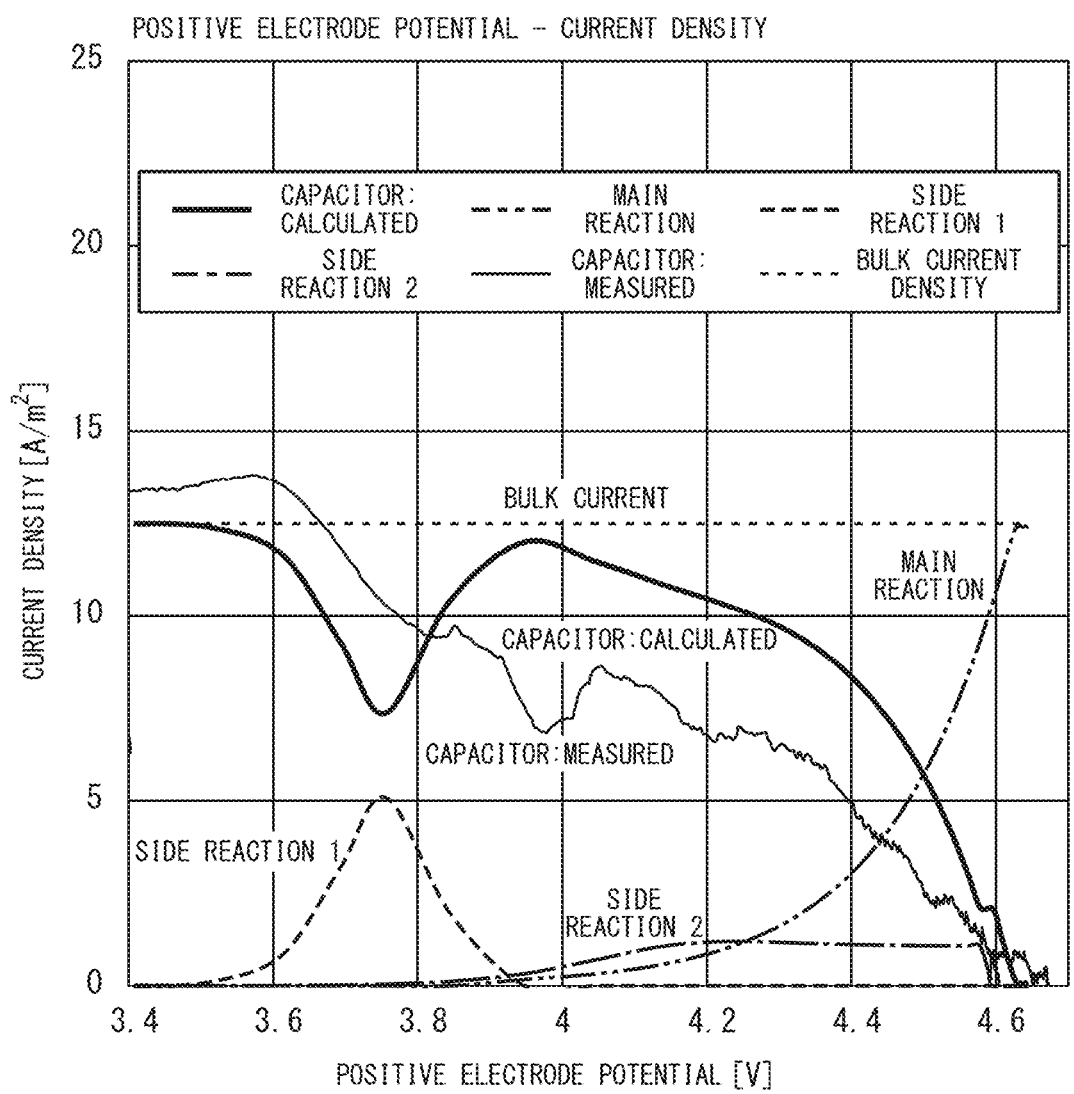
FIG. 6 is a graph showing the relationship between the positive electrode potential (V) and the current density ($A/m^2$) in Example of the doping method.

Based on the positive electrode potential E (V) and the bulk current density i (A/m$^2$) that were measured in the doping step, the bulk current density i was separated into the capacitor current density is and the current densities $i_R$ originating from the respective electrode reactions (the current density $i_{R1}$ of the main reaction, the current density $i_{R2}$ of the side reaction 1, and the current density $i_{R3}$ of the side reaction 2). FIG. 5 is a graph showing the relationship between the doping time (s) and each current density (A/m$^2$), and FIG. 6 is a graph showing the relationship between the positive electrode potential (V) and each current density (A/m$^2$).

Figure 7:
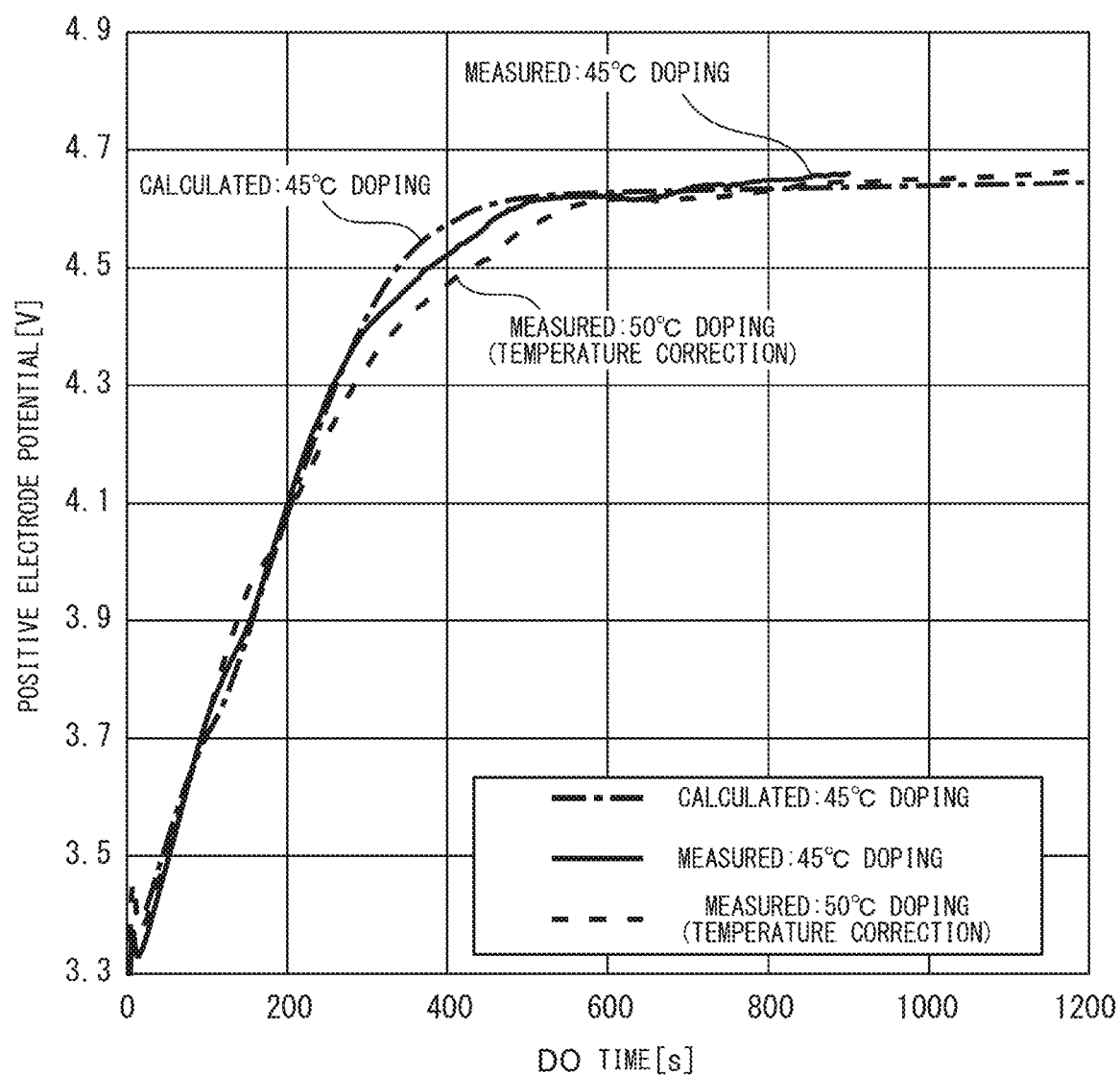
FIG. 7 is a graph comparing corrected (calculated) positive electrode potential (V) and measured positive electrode potential (V) in Example of the doping method.
Figure 8:
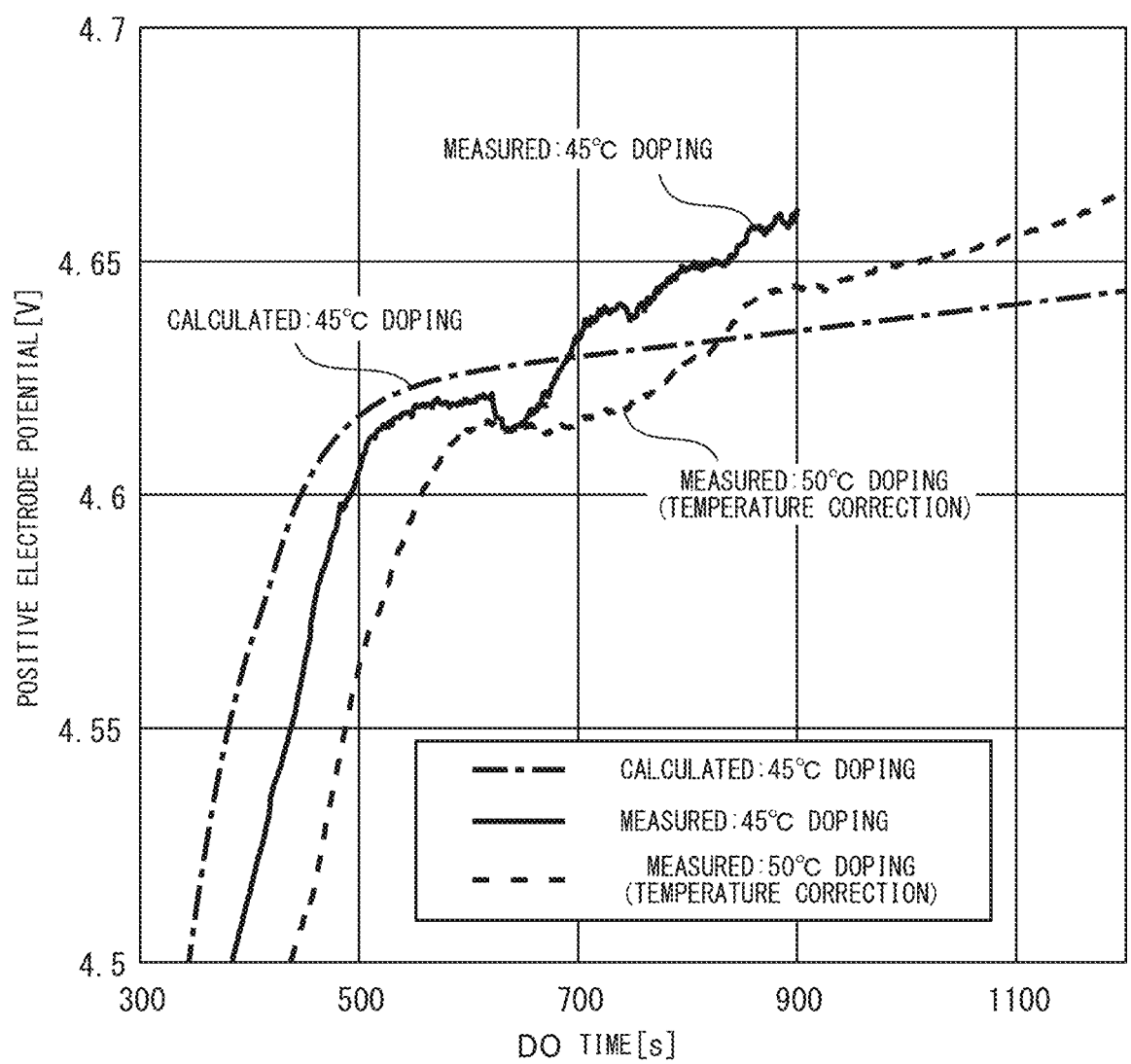
FIG. 8 is an enlarged view of a portion of FIG. 7 where the positive electrode potential is 4.5 V or higher after 300 seconds.

FIG. 7 shows the temporal change of the positive electrode potential from the start of doping (0 second) to 1,200 seconds in the doping step, and FIG. 8 shows an enlarged view of a portion of FIG. 7 where the positive electrode potential was 4.5 V or higher after 300 seconds. The temporal change of the corrected positive electrode potential E (V) obtained by the current separation ("Calculated: 45° C. doping" indicated by a dash-dot line in FIGS. 7 and 8) and the temporal change of the positive electrode potential E (V) measured in the doping step ("Measured: 45° C. doping" indicated by a solid line in FIGS. 7 and 8) were compared. As a result, the slope difference in the latter half of doping (700 seconds onward) was found to be greater than a preset threshold value; therefore, the doping conditions were modified to perform doping again using another element precursor (which was produced by the same production method as in the above-described "Production of Cell").

It is noted here that the way of modifying the doping conditions was determined based on the results of the corrected positive electrode potential obtained by performing current separation such that a total of the capacitor current density and the respective current densities (main reaction and side reactions 1 and 2) obtained in the doping step was equal to the bulk current density is and correcting the thus assumed positive electrode potential. Specifically, as a result of performing the current separation to determine the corrected positive electrode potential, it was found that lithium doping was not sufficiently performed in the main reaction; therefore, it was decided to raise the temperature of the doping conditions from 45° C. to 50° C.

The doping step was performed under the same doping conditions, except that other element precursor produced by the same production method as in the above-described "Production of Cell" was used and the doping temperature condition was changed to 50° C. When the temporal change of the positive electrode potential in the doping step performed after the modification of the condition was monitored ("Measured: 50° C. doping (temperature correction)" indicated by a broken line in FIGS. 7 and 8), it was found to be brought closer to the temporal change in the "Measured: 45° C. doping"; therefore, the doping step at 50° C. was deemed as an optimal doping condition. The reason for the difference between measurement and calculation is believed to be because, since the cell temperature was measured and controlled in terms of the temperature of the outer package of the cell, there was a difference between the set temperature and the actual reaction temperature inside the cell due to the surrounding environment of the cell (e.g., convection and heat dissipation by a restrainer jig).

As described above, the doping method was improved by employing the method of the present disclosure to recognize the difference between calculation and measurement based on an estimation of the status of the progress of the main reaction.

<Example of Doping Method in Real-Time Control>

The cell temperature and the input current were set at 45° C. and 50 mA, respectively, and doping was started. The bulk current flowing in the whole cell in the doping step was found to be 50 mA when measured while applying the input voltage to the cell. Conversion of this value into the bulk current density i yielded a value of 12.1 A/m$^2$. Further, the cell pressure during the doping step was 0.16 kgf/cm$^2$. In this Example, a charging program was set such that, under the above-described conditions, doping was started with constant-current (CC) charging and, once the voltage reached 4.5 V, the constant-current (CC) charging was switched to constant-voltage (CV) charging, after which doping was performed for another 2.5 hours.

First, in order to set a control target value, three reactions of a main reaction, a side reaction 1, and a side reaction 2 were assumed as electrode reactions. The main reaction was assumed to be a decomposition reaction of lithium carbonate in the presence of solvents (ethylene carbonate and ethyl methyl carbonate): $Li_2CO_3 + \text{solvents} \rightarrow 2Li^+ + 2CO_2 + C_xH_yO_z + 2e^-$. For this main reaction, parameters were set as follows: exchange current density $i_{01}=5.00E\text{-}03$ A/m$^2$, diffusion layer thickness $L_0=1.00E\text{-}04$ m, reductant bulk concentration $C^e_{R1}=1,000$ mol/m$^3$, reaction order $m_1=1$, symmetry factor $\alpha_1=0.1035$, valence $n_1=2$, onset potential $E_1^{eq}=4.23$ V, and diffusion coefficient $D_1=1.1E\text{-}10$ m$^2$/s.

The side reaction 1 was assumed to be a water splitting reaction: $H_2O \rightarrow H^+ + \cdot OH + e^-$. For this side reaction 1, parameters were set as follows: exchange current density $i_{02}=1.00E\text{-}03$ A/m$^2$, diffusion layer thickness $L_0=1.00E\text{-}04$ m, reductant bulk concentration $C^e_{R2}=80$ mol/m$^3$, reaction order $m_2=1$, symmetry factor $\alpha_2=0.6$, valence $n_2=1$, onset potential $E_2^{eq}=3.3$ V, and diffusion coefficient $D_2=5.8\text{E}-11$ m$^2$/s.

The side reaction 2 was assumed to be a decomposition reaction of the electrolyte solution solvent (solvent→(solvent**)+H$^+$+e$^-$. For this side reaction 2, parameters were set as follows: exchange current density $i_{03}=1.00\text{E}-03$ A/m$^2$, diffusion layer thickness $L_0=1.00\text{E}-04$ m, reductant bulk concentration $C^e{}_{R3}=600$ mol/m$^3$, reaction order $m_3=1$, symmetry factor $\alpha_3=0.3$, valence $n_3=1$, onset potential $E_3^{eq}=3.45$ V, and diffusion coefficient $D_3=2.6\text{E}-14$ m$^2$/s. The set values of these parameters are summarized in Table 2 below.

TABLE 2

| Item | Symbol | Unit | Capacitor | Main reaction | Side reaction 1 | Side reaction 2 |
|---|---|---|---|---|---|---|
| Onset potential | $E^{eq}$ | V | 3.3 | 4.23 | 3.3 | 3.45 |
| Capacitor capacity | C | F/m$^2$ | 2,800 | — | — | — |
| Initial amount | $W_0$ | mol/m$^2$-cell | — | 0.27778 | 0.00417 | 0.03889 |
| Reductant bulk concentration | $C^e R$ | mol/m$^3$ | — | 1,000 | 80 | 600 |
| Diffusion coefficient | D | m$^2$/s | — | 1.1E−10 | 5.8E−11 | 2.6E−14 |
| Exchange current density | $i_0$ | A/m$^2$ | — | 5.00E−03 | 1.00E−03 | 1.00E−03 |
| Valence | n | — | — | 2 | 1 | 1 |
| Symmetry factor | $\alpha$ | — | — | 0.1035 | 0.6 | 0.3 |
| Diffusion layer thickness | $L_0$ | m | — | 1.00E−04 | 1.00E−04 | 1.00E−04 |
| Reaction order | m | — | — | 1 | 1 | 1 |

The initial amount $W_0$ is the amount of a main substance added for each reaction (Li carbonate for the main reaction; water or the like for the side reactions).

Based on the positive electrode potential E (V) and the bulk current density i (A/m$^2$) that were measured in the doping step, the bulk current density i was separated into the capacitor current density $i_C$ and the current densities $i_R$ originating from the respective electrode reactions (the current density $i_{R1}$ of the main reaction, the current density $i_{R2}$ of the side reaction 1, and the current density $i_{R3}$ of the side reaction 2).

Figure 9:
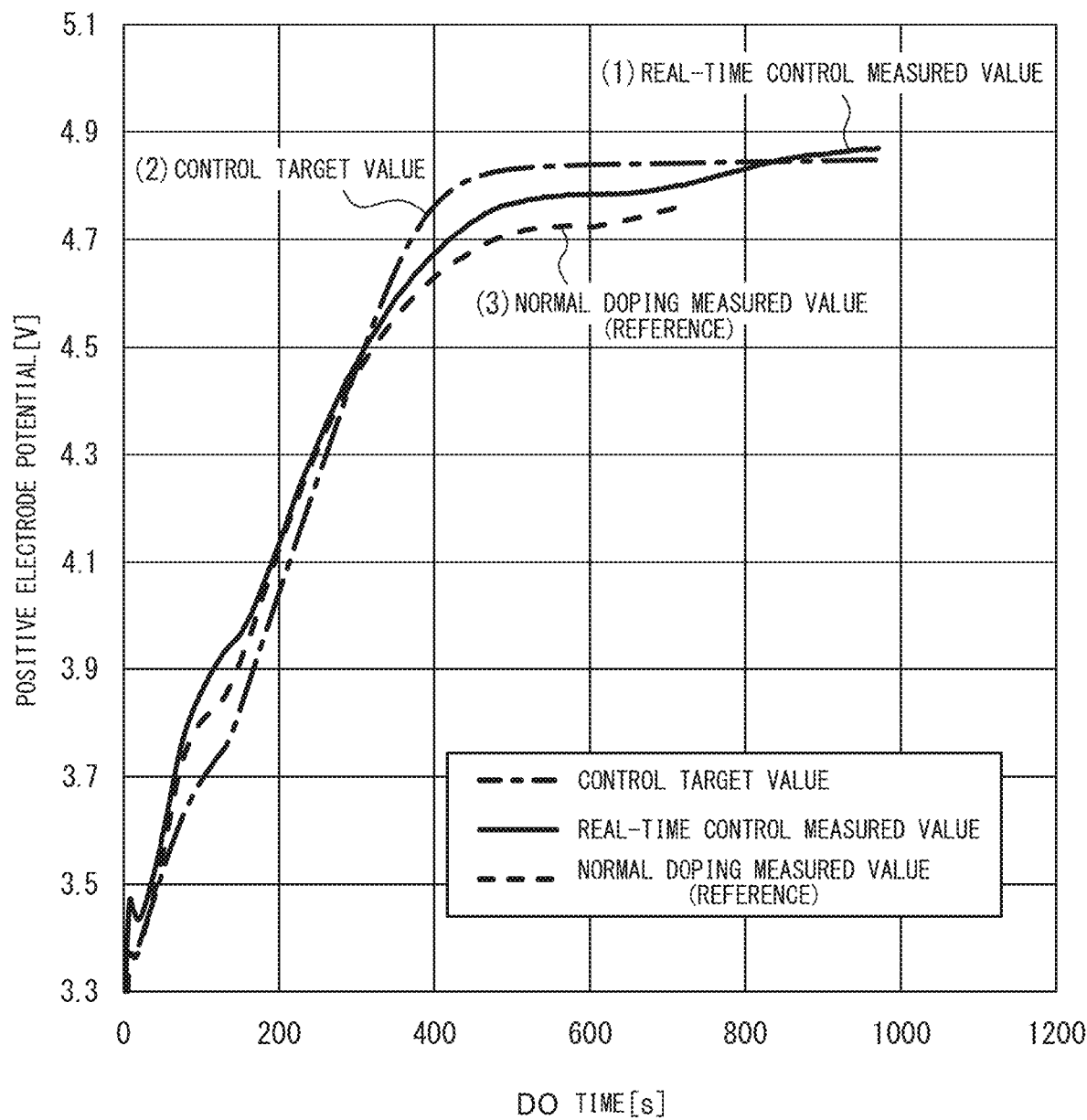
FIG. 9 shows temporal change of the positive electrode potential from the start of doping (0 second) to about 950 seconds in Example of the doping method with real-time control.

FIG. 9 shows temporal change of the positive electrode potential from the start of doping (0 seconds) to about 950 seconds in the doping step. At the doping time of 600 seconds, it was detected that the measured value (1) was lower by at least 50 mV than the control target value (2) of the positive electrode potential that was calculated using the parameters shown in Table 2; therefore, a control was executed to correct the doping conditions to a program of CC charging to a cell voltage of 4.6 V without changing the current value of 50 mA (real-time control). In this process, the way of instantaneously modifying the doping conditions was controlled in such a manner that the results of the corrected positive electrode potential obtained by, based on the measured value (1) obtained in the doping step, performing current separation such that a total of the capacitor current density and the respective current densities (main reaction and side reactions 1 and 2) was equal to the bulk current density $i_C$ and correcting the thus assumed positive electrode potential, namely the set parameters of the corrected positive electrode potential that represent the capacitor current density and the respective current densities (main reaction and side reactions 1 and 2), are brought closer to the parameters shown in Table 2.

<Comparative Example>

The doping conditions were controlled in a program in which other element precursor, which was produced by the same production method as in the above-described "Production of Cell", was CC charged to a cell voltage of 4.5 V under the same doping start conditions. As a result, the difference from the control target value (2) of the positive electrode potential was found to be larger than the difference from the real-time control measured value (1).

As demonstrated above, the use of the current separation method, the doping method, and the doping apparatus of the present disclosure enabled to bring the positive electrode potential closer to a control target value.

INDUSTRIAL APPLICABILITY

According to the current separation method, the doping method, and the doping apparatus of the present disclosure, the status of the progress of a main reaction can be estimated in the lithium carbonate decomposition-type doping step of a nonaqueous lithium power storage element and, in a preferred embodiment, doping conditions can be more appropriately controlled in real time. Therefore, the current separation method, the doping method, and the doping apparatus of the present disclosure can be utilized for, for example, management, prediction, or improvement of the performance of a nonaqueous lithium power storage element to be obtained. More specifically, a learned model which has learned the correlation of the electrode production data and the status of the progress of the main reaction estimated by the method of the present disclosure with the actual performance of a nonaqueous lithium power storage element at the time can be obtained. By inputting the electrode production data of an unknown system and the status of the progress of the main reaction to the learned model, the performance of the resulting nonaqueous lithium power storage element can be predicted, and whether or not a specific performance level is satisfied can be managed. Alternatively, when the desired performance of a nonaqueous lithium power storage element are input to the learned model, the learned model outputs preferred electrode production conditions and/or doping conditions that can be utilized for improvement of the performance.

REFERENCE SIGNS LIST

S1: Doping condition setting step
S2: Measurement step
S3: Current density calculation step S4: Positive electrode potential correction step
S5: Current separation step
S6: Doping condition modification step (doping condition control step)
S7: Termination/continuation step
10: Information processing apparatus (control apparatus)
10a: First control apparatus
10b: Second control apparatus
11: Doping condition setting unit
12: Measurement unit
13: Information processing unit
14: Current density calculation unit
15: Positive electrode potential correction unit
16: Current separation unit
17: Doping condition modification unit (doping condition control unit)
18: Exhaust gas flow rate adjustment unit
20: Condition adjustment device (adjustment apparatus)
21: Charge-discharge device
22: Temperature regulator
23: Pressure regulator
30: Measurement apparatus
31: Voltage line
32: Reference electrode
33: Current line
34: Thermocouple
35: Pressure gauge
41: Doping/aging bath
42: Vent pipe
43: Flow rate adjustment device
44: Filter
50: Display device
60: Warning device
51: Doping condition setting step
S2: Measurement step
S3: Current density calculation step
S4: Positive electrode potential correction step
S5: Current separation step
S6: Doping condition modification step
S7: Termination/continuation step

The invention claimed is:

1. A current separation method of a nonaqueous lithium power storage element, wherein
the nonaqueous lithium power storage element comprises a cell comprising: a positive electrode precursor that comprises a positive electrode active material layer comprising lithium carbonate and activated carbon; a negative electrode that comprises a negative electrode active material layer comprising a negative electrode active material capable of occluding and releasing lithium; a separator arranged between the positive electrode precursor and the negative electrode; and an electrolyte solution, and the method comprises:
(a) calculating a capacitor current density ($i_c$) and an electrode reaction current densities of electrode reactions 1 to N ($i_{R1}$ to $i_{RN}$) of the cell based on positive electrode potential (E) and current bulk current density (i) of the cell that are measured during doping of the cell,
(b) the doping condition setting step of setting doping conditions including cell temperature and input voltage;
(c) the measurement step of measuring a positive electrode potential (E) and a bulk current density (i) of the cell while applying the input voltage to the cell;
(d) the current density calculation step of, with an assumption of the positive electrode potential (E) at the time of modifying the system time by $\Delta t$, calculating the capacitor current density ($i_c$) of the cell and calculating, based on the Butler-Volmer equation and the diffusion equation, current densities of electrode reactions 1 to N ($i_{R1}$ to $i_{RN}$), wherein, N represents an integer of 3 or larger, including an electrode reaction 1 in which lithium carbonate is decomposed to release lithium ions and electrons;
(e) the positive electrode potential correction step of correcting the assumed positive electrode potential (E) such that a total current density of the capacitor current density ($i_c$) and the current densities of the respective electrode reactions ($i_{R1}$ to $i_{RN}$) is equal to the bulk current density (i), and thereby obtaining a corrected positive electrode potential (E); and
(f) the current separation step of repeating the steps (d) and (e) while modifying the system time such that the total current density converges to the bulk current density (i).

2. A doping method of a nonaqueous lithium power storage element, wherein
the nonaqueous lithium power storage element comprises a cell comprising: a positive electrode precursor that comprises a positive electrode active material layer comprising lithium carbonate and activated carbon; a negative electrode that comprises a negative electrode active material layer comprising a negative electrode active material capable of occluding and releasing lithium; a separator arranged between the positive electrode precursor and the negative electrode; and an electrolyte solution, and
the method comprises calculating a capacitor current density ($i_c$) and an electrode reaction current densities of electrode reactions 1 to N ($i_{R1}$ to $i_{RN}$) of the cell by the current separation method according to claim 1.

3. The doping method of a nonaqueous lithium power storage element according to claim 2, further comprising (g) the steps of controlling the doping conditions set in the step (b) and repeating the steps (c) to (f) such that a difference between the behavior of the corrected positive electrode potential (E) obtained in the current separation step and the behavior of a target positive electrode potential (E) is smaller than that of the previous steps (c) to (f) during doping.

4. The doping method of a nonaqueous lithium power storage element according to claim 2, wherein, in the step (d), the current densities ($i_{R1}$ to $i_{RN}$) are calculated based on the following standards:
(i) in a case where the measured positive electrode potential (E) is lower than an onset potential of an electrode reaction x, {wherein, x corresponds to 1 to N, the current density ($i_{Rx}$) of the electrode reaction x is not generated (0 A/m$^2$);
(ii) in a case where the measured positive electrode potential (E) is equal to or higher than the onset potential of the electrode reaction x, the current density of the electrode reaction x is determined by the Butler-Volmer equation and, when the thus determined current density is lower than a limiting current density of the electrode reaction x, this current density is defined as the current density ($i_{Rx}$) of the electrode reaction x; and
(iii) in a case where the current density determined based on the above-described (ii) is equal to or higher than the limiting current density of the electrode reaction x, a current density determined by the diffusion equation and the Butler-Volmer equation is defined as the current density ($i_{Rx}$) of the electrode reaction x.

5. The doping method of a nonaqueous lithium power storage element according to claim 4, wherein
in the standard (ii), the Butler-Volmer equation of the respective electrode reactions 1 to N is represented by:

$$i_{Rx} = i_{0x} \left\{ \left( \frac{C_{Rx}}{C_{Rx}^e} \right)^{m_x} \exp\left( \frac{\alpha_x n_x F}{RT} \eta_x \right) - \exp\left( -\frac{(1-\alpha_x)n_x F}{RT} \eta_x \right) \right\}$$

$$\eta_x = E - E_x^{eq}$$

{wherein, $i_{Rx}$ represents the current density (A/m$^2$) of the electrode reaction x, wherein, x corresponds to 1 to N; $i_{0x}$ represents an exchange current density (A/m$^2$) of the electrode reaction x; $C_{Rx}$ and $C^e_{Rx}$ represent a reductant surface concentration (mol/m$^3$) and a reductant bulk concentration (mol/m$^3$) of the electrode reaction x, respectively; $m_x$ represents a reaction order (=1); $\alpha_x$ represents a symmetry factor of the electrode reaction x; $n_x$ represents a valence of the electrode reaction x; F represents the Faraday constant; R represents the gas constant; T represents the temperature (K); $\eta_x$ represents an overvoltage (V) of the electrode reaction x; E represents the assumed positive electrode potential (V); and $E_x^{eq}$ represents the onset potential (V) of the electrode reaction x}, and in the standard (iii), the diffusion equation of the respective electrode reactions 1 to N is represented by:

$$\frac{\partial C_{Rx}}{\partial t} = D_x \frac{\partial^2 C_{Rx}}{\partial r^2}$$

{wherein, t represents time (s); CRx represents the reductant surface concentration (mol/m$^3$) of the electrode reaction x, wherein, x corresponds to 1 to N; $D_x$ represents a reductant diffusion coefficient (m$^2$/s); and r represents a diffusion layer thickness (m)},
with a proviso that:
when r=0, $$C_{Rx} = C_{Rx}^e$$

{wherein, CeRx represents the reductant bulk concentration (mol/m$^3$)}; or
when r=L$_0$ (diffusion layer thickness), $$-D_x \frac{\partial C_{Rx}}{\partial r} = Q_x = \frac{i_{Rx}}{n_x F}$$

{wherein, $n_x$ represents the valence of the electrode reaction x; F represents the Faraday constant; $Q_x$ represents a reductant mass flux (mol/m$^2$s); and $i_{Rx}$ represents the current density (A/m$^2$) of the electrode reaction x}.

6. The doping method of a nonaqueous lithium power storage element according to claim 5, wherein, in the current density calculation step (d):
the electrode reaction 1 is selected to have an onset potential ($E_1^{eq}$) in a range of 3.70 V to 4.00 V, a diffusion coefficient ($D_1$) in a range of 1.5E-10 m$^2$/s to 1.7E-10 m$^2$/s, an exchange current density ($i_{01}$) in a range of 4.00E-03 A/m$^2$ to 6.00E-03 A/m$^2$, and a symmetry factor ($\alpha_1$) in a range of 0.07 to 0.10, and
the electrode reactions 2 to N are each independently selected to have an onset potential ($E_x^{eq}$) in a range of 3.00 V to 3.50 V, a diffusion coefficient ($D_x$) in a range of 0.5E-10 m$^2$/s to 1.5E-10 m$^2$/s, an exchange current density ($i_{0x}$) in a range of 0.50E-03 A/m$^2$ to 3.00E-03 A/m$^2$, a valence ($n_x$) in a range of an integer of 1 to 4, and a symmetry factor ($\alpha_1$) in a range of 0.10 to 0.90.

7. The doping method of a nonaqueous lithium power storage element according to claim 2, wherein, in the step (b), the cell temperature is selected from 25° C. to 80° C. and the input voltage is selected from 4.0 V to 5.0 V.

8. The doping method of a nonaqueous lithium power storage element according to claim 2, wherein, in the step (d), the current density ($i_c$) of the cell is calculated by calculating a capacitor current ($I_c$) of the cell using the following equation, and dividing the thus obtained value by a positive electrode precursor area (m$^2$):

$$I_C = C \frac{dE}{dt}$$

{wherein, $I_c$ represents the capacitor current (A); C represents a capacitor capacity (F/m$^2$); E represents the assumed positive electrode potential (E); and t represents time (s)}.

9. A doping apparatus of a nonaqueous lithium power storage element, wherein
the nonaqueous lithium power storage element comprises a cell comprising: a positive electrode precursor that comprises a positive electrode active material layer comprising lithium carbonate and activated carbon; a negative electrode that comprises a negative electrode active material layer comprising a negative electrode active material capable of occluding and releasing lithium; a separator arranged between the positive electrode precursor and the negative electrode; and an electrolyte solution, and
the doping apparatus comprises a control apparatus that mathematically separates a bulk current density in the doping step into a capacitor current density ($i_c$) and an electrode reaction current densities of electrode reactions 1 to N ($i_{R1}$ to $i_{RN}$) by the current separation method according to claim 1,
wherein the control apparatus comprises the following control units:
(a) a doping condition setting unit which sets doping conditions including cell temperature and input voltage;
(b) a measurement unit which measures a positive electrode potential (E) and bulk current density (i) of the cell while applying the input voltage to the cell;
(c) a current density calculation unit which, assuming the positive electrode potential (E) at the time of modifying the system time by Δt, calculates the capacitor current density ($i_c$) of the cell and calculates, based on the Butler-Volmer equation and the diffusion equation, current densities of electrode reactions 1 to N ($i_{R1}$ to $i_{RN}$) (wherein, N represents an integer of 3 or larger) including an electrode reaction 1 in which lithium carbonate is decomposed to release lithium ions and electrons;
(d) a positive electrode potential correction unit which corrects the assumed positive electrode potential (E) such that a total current density of the capacitor current density ($i_c$) and the current densities ($i_{R1}$ to $i_{RN}$) of the respective electrode reactions is equal to the bulk current density (i), and thereby obtains a corrected positive electrode potential (E); and
(e) a current separation unit which repeats the controls performed by the control units (c) and (d) while modifying the system time such that the total current density converges to the bulk current density (i).

10. The doping apparatus of a nonaqueous lithium power storage element according to claim 9, further comprising (f) a doping condition control unit which controls the doping conditions set in the control unit (a) and repeats the steps (c) to (f) in claim 1 such that a difference between the behavior of the corrected positive electrode potential (E) obtained by the current separation unit and the behavior of a target positive electrode potential (E) is smaller than that of the previous steps (c) to (f) doping.

11. The doping apparatus according to claim 10, wherein the control unit (f) is included in a control apparatus different from the control apparatus that comprises the control units (a) to (e).

12. The doping apparatus of a nonaqueous lithium power storage element according to claim 9, wherein the calculation by the control unit (c) is performed based on the following standards:
(i) in a case where the measured positive electrode potential (E) is lower than an onset potential of an electrode reaction x (wherein, x corresponds to 1 to N), the current density ($i_{Rx}$) of the electrode reaction x is not generated (0 A/m²);
(ii) in a case where the measured positive electrode potential (E) is equal to or higher than the onset potential of the electrode reaction x, the current density of the electrode reaction x is determined by the Butler-Volmer equation and, when the thus determined current density is lower than a limiting current density of the electrode reaction x, this current density is defined as the current density ($i_{Rx}$) of the electrode reaction x; and
(iii) in a case where the current density determined based on the above-described (ii) is equal to or higher than the limiting current density of the electrode reaction x, a current density determined by the diffusion equation and the Butler-Volmer equation is defined as the current density ($i_{Rx}$) of the electrode reaction x.

13. The doping apparatus of a nonaqueous lithium power storage element according to claim 9, wherein, in the control unit (a), the cell temperature is selected from 25° C. to 80° C. and the input voltage is selected from 4.0 V to 5.0 V.

14. The doping apparatus of a nonaqueous lithium power storage element according to claim 9, wherein, in the control unit (c), the current density ($i_c$) of the cell is calculated by calculating a capacitor current ($I_c$) of the cell using the following equation, and dividing the thus obtained value by a positive electrode precursor area (m²):

$$I_C = C\frac{dE}{dt}$$

{wherein, $I_c$ represents the capacitor current (A); C represents a capacitor capacity (F/m²); E represents the assumed positive electrode potential (E); and t represents time (s)}.

15. The doping apparatus of a nonaqueous lithium power storage element according to claim 14, wherein,
in the standard (ii), the Butler-Volmer equation of the respective electrode reactions 1 to N is represented by:

$$i_{Rx} = i_{0x}\left\{\left(\frac{C_{Rx}}{C_{Rx}^e}\right)^{m_x}\exp\left(\frac{\alpha_x n_x F}{RT}\eta_x\right) - \exp\left(-\frac{(1-\alpha_x)n_x F}{RT}\eta_x\right)\right\}$$

$$\eta_x = E - E_x^{eq}$$

{wherein, $i_{Rx}$ represents the current density (A/m²) of the electrode reaction x, {wherein, x corresponds to 1 to N}; $i_{0x}$ represents an exchange current density (A/m²) of the electrode reaction x; $C_{Rx}$ and $C^e_{Rx}$ represent a reductant surface concentration (mol/m³) and a reductant bulk concentration (mol/m³) of the electrode reaction x, respectively; $m_x$ represents a reaction order (=1); $\alpha_x$ represents a symmetry factor of the electrode reaction x; $n_x$ represents a valence of the electrode reaction x; F represents the Faraday constant; R represents the gas constant; T represents the temperature (K); $\eta_x$ represents an overvoltage (V) of the electrode reaction x; E represents the assumed positive electrode potential (V); and $E_x^{eq}$ represents the onset potential (V) of the electrode reaction x}, and
in the standard (iii), the diffusion equation of the respective electrode reactions 1 to N is represented by:

$$\frac{\partial C_{Rx}}{\partial t} = D_x \frac{\partial^2 C_{Rx}}{\partial r^2}$$

{wherein, t represents time (s); $C_{Rx}$ represents the reductant surface concentration (mol/m³) of the electrode reaction x, wherein, x corresponds to 1 to N; $D_x$ represents a reductant diffusion coefficient (m²/s); and r represents a diffusion layer thickness (m)},
with a proviso that:
when r=0, $$C_{Rx} = C_{Rx}^e$$

{wherein, $Ce_{Rx}$ represents the reductant bulk concentration (mol/m³)}; or
when r=Lo (diffusion layer thickness), $$-D_x\frac{\partial C_{Rx}}{\partial r} = Q_x = \frac{i_{Rx}}{n_x F}$$

{wherein, nx represents the valence of the electrode reaction x; F represents the Faraday constant; $Q_x$ represents a reductant mass flux (mol/m²s); and $i_{Rx}$ represents the current density (A/m²) of the electrode reaction x}.

16. The doping apparatus of a nonaqueous lithium power storage element according to claim 15, wherein, in the current separation unit:
the electrode reaction 1 is selected to have an onset potential ($E_1^{eq}$) in a range of 3.70 V to 4.00 V, a diffusion coefficient ($D_1$) in a range of 1.5E-10 m²/s to 1.7E-10 m²/s, an exchange current density ($i_{01}$) in a range of 4.00E-03 A/m² to 6.00E-03 A/m², and a symmetry factor ($\alpha_1$) in a range of 0.07 to 0.10, and the electrode reactions 2 to N are each independently selected to have an onset potential ($E_x^{eq}$) in a range of 3.00 V to 3.50 V, a diffusion coefficient ($D_x$) in a range of 0.5E-10 m²/s to 1.5E-10 m²/s, an exchange current density ($i_{0x}$) in a range of 0.50E-03 A/m₂ to 3.00E-03 A/m², a valence ($n_x$) in a range of an integer of 1 to 4, and a symmetry factor ($\alpha_1$) in a range of 0.10 to 0.90.

17. A doping system of a nonaqueous lithium power storage element, comprising:

the doping apparatus according to claim 9;

an adjustment apparatus which adjusts the cell temperature and the input voltage based on signals from the control apparatus; and a measurement apparatus which acquires information regarding the positive electrode potential (E) and the bulk current density (i) of the cell, and transmits signals relating to the thus acquired information to the control apparatus.

18. The doping system of a nonaqueous lithium power storage element according to claim 17, further comprising a display device which displays information regarding the status of the progress of at least one electrode reaction in the doping step.

19. The doping system of a nonaqueous lithium power storage element according to claim 17, further comprising a warning device which can issue a warning in accordance with the contents of real-time control in the doping step.

* * * * *